(12) United States Patent
Thormundsson et al.

(10) Patent No.: US 8,983,092 B2
(45) Date of Patent: Mar. 17, 2015

(54) WAVEFORM SHAPING SYSTEM TO PREVENT ELECTRICAL AND MECHANICAL SATURATION IN LOUD SPEAKERS

(75) Inventors: Trausti Thormundsson, Irvine, CA (US); Govind Kannan, Corona Del Mar, CA (US); Shlomi I. Regev, Irvine, CA (US); James W. Wihardja, Fullerton, CA (US); Yair Kerner, Kiryat Ono (IL); Harry K. Lau, Norwalk, CA (US); Ragnar H. Jonsson, Laguna Niguel, CA (US)

(73) Assignee: Conexant Systems, Inc., Newport Beach, CA (US)

( * ) Notice: Subject to any disclaimer, the term of this patent is extended or adjusted under 35 U.S.C. 154(b) by 826 days.

(21) Appl. No.: 13/183,288

(22) Filed: Jul. 14, 2011

(65) Prior Publication Data

US 2012/0016501 A1     Jan. 19, 2012

Related U.S. Application Data

(60) Provisional application No. 61/364,706, filed on Jul. 15, 2010, provisional application No. 61/364,594, filed on Jul. 15, 2010.

(51) Int. Cl.
*H03G 7/00*     (2006.01)

(52) U.S. Cl.
CPC ..................................... *H03G 7/007* (2013.01)
USPC ........... 381/106; 381/100; 381/104; 381/107; 381/55; 381/56

(58) Field of Classification Search
CPC ...... H04R 25/356; H04R 25/502; H04R 3/12; H04R 25/505; H04R 3/04; H04R 3/00; H04R 5/04; H04R 3/002; H04R 29/00; H04R 3/007; H03G 11/00; H03G 7/00; H03G 3/001; H03G 3/005
USPC ............ 381/106, 100, 104, 108, 55, 56, 94.1, 381/96, 98
See application file for complete search history.

(56) References Cited

U.S. PATENT DOCUMENTS

| | | | |
|---|---|---|---|
| 4,495,640 | A | 1/1985 | Frey |
| 5,528,695 | A | 6/1996 | Klippel |

(Continued)

FOREIGN PATENT DOCUMENTS

| | | |
|---|---|---|
| EP | 1798852 A2 | 6/2007 |
| KR | 1020050052347 A | 6/2005 |

(Continued)

OTHER PUBLICATIONS

Klippel, Wolfgang; Measurement of Impulsive Distortion, Rub and Buzz and other Disturbances; 114th Convention of the AES; Mar. 22, 2003, 10 pages.

(Continued)

*Primary Examiner* — Paul S Kim
(74) *Attorney, Agent, or Firm* — Haynes and Boone, LLP

(57) ABSTRACT

Peak reduction and power limitations are used to prevent distortion and protect components. In a cellular telephone, peak reduction can be based on battery power level to prevent electrical distortion from saturation. In addition peak reduction can be used to prevent mechanical distortion such as rub and buzz. Dynamic range compression can be used for peak reduction. In another application dynamic range compression can be used to control the power output to protect a speaker from damage. One example of a dynamic range compressor/peak limiter comprises a look-ahead buffer and an analysis engine. For example, the look-ahead buffer holds a window of samples of a signal. The analysis engine selects a gain envelope function on the basis of the samples, for example, by selecting the Pth sample in the buffer whenever that sample exceeds a given threshold.

20 Claims, 26 Drawing Sheets

(56) References Cited

U.S. PATENT DOCUMENTS

| | | | |
|---|---|---|---|
| 6,058,195 A | 5/2000 | Klippel | |
| 6,201,873 B1 | 3/2001 | Dal Farra | |
| 6,535,846 B1 * | 3/2003 | Shashoua | 704/225 |
| 2002/0159605 A1 | 10/2002 | Yoshino et al. | |
| 2004/0071299 A1 | 4/2004 | Yoshino | |
| 2005/0276425 A1 | 12/2005 | Forrester et al. | |
| 2007/0140513 A1 * | 6/2007 | Furge | 381/120 |
| 2008/0152168 A1 | 6/2008 | Magrath | |

FOREIGN PATENT DOCUMENTS

| | | |
|---|---|---|
| KR | 1020050098113 A | 10/2005 |
| WO | 2007/076299 | 7/2007 |

OTHER PUBLICATIONS

European Patent Office; Invitation to Pay Additional Fees; PCT Application No. PCT/US2011/044242, Oct. 12, 2011.

European Patent Office; Invitation to Pay Additional Fees; PCT Application No. PCT/US2011/044068, Sep. 27, 2011.

European Patent Office; International Search Report and Written Opinion; PCT Application No. PCT/US2011/044068, Dec. 9, 2011.

European Patent Office; International Search Report and Written Opinion; PCT Application No. PCT/US2011/044242, Jan. 26, 2012.

Korean Intellectual Property Office; International Search Report; PCT Application No. PCT/US2010/025282; Oct. 13, 2010.

Korean Intellectual Property Office; Written Opinion; PCT Application No. PCT/US2010/025282; Oct. 13, 2010.

Korean Intellectual Property Office; International Preliminary Report on Patentability; PCT Application No. PCT/US2010/025282; Oct. 13, 2010.

The International Bureau of WIPO; International Preliminary Report on Patentability; PCT Application No. PCT/US2011/044068, Jan. 24, 2013.

The International Bureau of WIPO; International Preliminary Report on Patentability; PCT Application No. PCT/US2011/044242, Jan. 24, 2013.

European Patent Office; Supplementary European Search Report; European Application No. 10746794.6, Apr. 23, 2012.

* cited by examiner

US 8,983,092 B2

WAVEFORM SHAPING SYSTEM TO PREVENT ELECTRICAL AND MECHANICAL SATURATION IN LOUD SPEAKERS

RELATED APPLICATIONS

This application claims priority to U.S. Provisional patent application No. 61/364,706, filed Jul. 15, 2010, which is hereby incorporated by reference for all purposes. This application is related to commonly-assigned U.S. patent application Ser. No. 12/712,108, filed Feb. 24, 2010; U.S. provisional Patent application 61/360,720, filed Jul. 1, 2010; and U.S. provisional Patent application 61/364,594, filed Jul. 15, 2010.

TECHNICAL FIELD

This disclosure relates to reducing distortion due to electrical and mechanical limits in an audio system and specifically to reducing peaks in a waveform to prevent distortion.

BACKGROUND OF THE INVENTION

Electronic systems often require signals to stay within a certain range to function properly. For example, many analog components operate linearly within a given range of voltages, but begin to behave in a non-linear fashion when voltages become too large often leading to saturation of those components. As a result, peak reduction is used in these systems to maintain linearity.

Common methods of limiting input signals include dynamic range compression where an input signal is subjected to a predetermined input-output function, phase manipulation, which can be applied to certain types of signals such as speech, and automatic gain control. These solutions have either limitations or undesirable spectral effects.

SUMMARY OF THE INVENTION

A method and system for limiting peaks in a signal that includes a look-ahead buffer and an analysis engine.

Other systems, methods, features, and advantages of the present disclosure will be or become apparent to one with skill in the art upon examination of the following drawings and detailed description. It is intended that all such additional systems, methods, features, and advantages be included within this description, be within the scope of the present disclosure, and be protected by the accompanying claims.

BRIEF DESCRIPTION OF THE SEVERAL VIEWS OF THE DRAWINGS

Aspects of the disclosure can be better understood with reference to the following drawings. The components in the drawings are not necessarily to scale, emphasis instead being placed upon clearly illustrating the principles of the present disclosure. Moreover, in the drawings, like reference numerals designate corresponding parts throughout the several views, and in which.

DETAILED DESCRIPTION OF THE INVENTION

Figure 1:
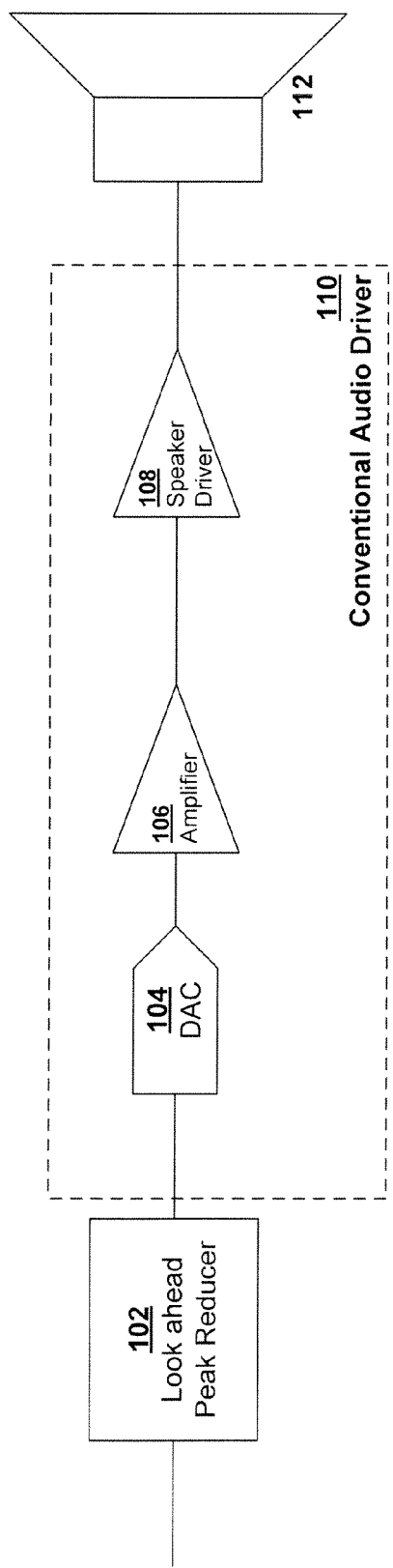
FIG. 1 shows an embodiment of an output audio driver.

In the description that follows, like parts are marked throughout the specification and drawings with the same reference numerals. The drawing figures might not be to scale and certain components can be shown in generalized or schematic form and identified by commercial designations in the interest of clarity and conciseness.

In one embodiment, a look-ahead buffer holds a window of samples of a signal. An analysis engine selects a gain envelope function on the basis of the samples, for example, by selecting the Pth sample in the buffer whenever that sample exceeds a given threshold. The threshold could be an upper limit or a lower limit or both. The analysis engine then outputs the oldest of the samples in the look-ahead buffer and receives a new sample. The process continues to repeat.

In another embodiment the system can further comprise a model for converting the signal into a derived signal, for example, the original signal can be an audio signal and the derived signal is the speaker displacement. The converted signal is peak reduced by a peak reduction system and an inverse model restores the signal back into the original form. In addition, a second look-ahead peak reduction system can be cascaded with the inverse model. For example, the first look-ahead peak reduction system can limit displacement to avoid mechanical distortion and the second look-ahead peak reduction system can limit peaks in the audio signal to avoid electrical saturation distortion.

In yet another embodiment, a model converts the signal into a derived signal, but also stores a window of samples of the derived signal. The analysis engine determines a gain envelope function on the basis of the samples of the derived signal or on the basis of the samples of the original samples or both.

In another embodiment, the peak reduction system can receive a battery power level and determine a threshold to avoid electrical saturation distortion based on the battery level.

In another embodiment, a cellular telephone comprises an audio driver having a dynamic range compressor (DRC). The DRC uses a threshold based upon a battery power level.

In another embodiment, an audio driver comprises a digital to audio converter (DAC), a high pass filter, an amplifier, an output driver. It also comprises a root-mean-square (RMS) estimation module and a dynamic range compressor either in an open loop or closed loop configuration. The RMS estimation module estimates the power output by the audio driver or the power input into the amplifier. Based on a threshold the DRC ensures the power output is not sustained beyond the threshold.

FIG. 1 shows an embodiment of an output audio driver. Audio driver 100 comprises look-ahead peak reducer 102 and conventional audio driver 110. The audio driver is shown in FIG. 1 as driving speaker 112. Conventional audio driver 110 includes DAC 104, amplifier 106 and speaker driver 108. In some embodiments, amplifier 106 and speaker driver 108 are combined into a single circuit. Look-ahead peak reducer 102 is used to limit the peaks in an input audio signal to reduce distortion which can be introduced into the system. For example, digital clipping can take place at the DAC if the input audio signal exceeds the range of the DAC. Also, amplifier 106 and/or speaker driver 108 can be driven out of their linear region into a saturation region if the voltage received becomes too great. Mechanical distortion in speaker 112 itself can take place. For example, rub and buzz distortion takes place when the voltage received is too great, causing the inward displacement to become too high. If the inward displacement is too high, the speaker cone can hit the back of the speaker, which causes an annoying buzz sound. By reducing the peaks in the input signal, both mechanical distortion and electrical distortion can take place. However, it should be noted that the act of peak reduction itself can introduce spectral artifacts as well. Therefore, look-ahead peak reducer 102 should reduce the peaks while having as little impact on the perceived audio quality as is practical.

Figure 2:
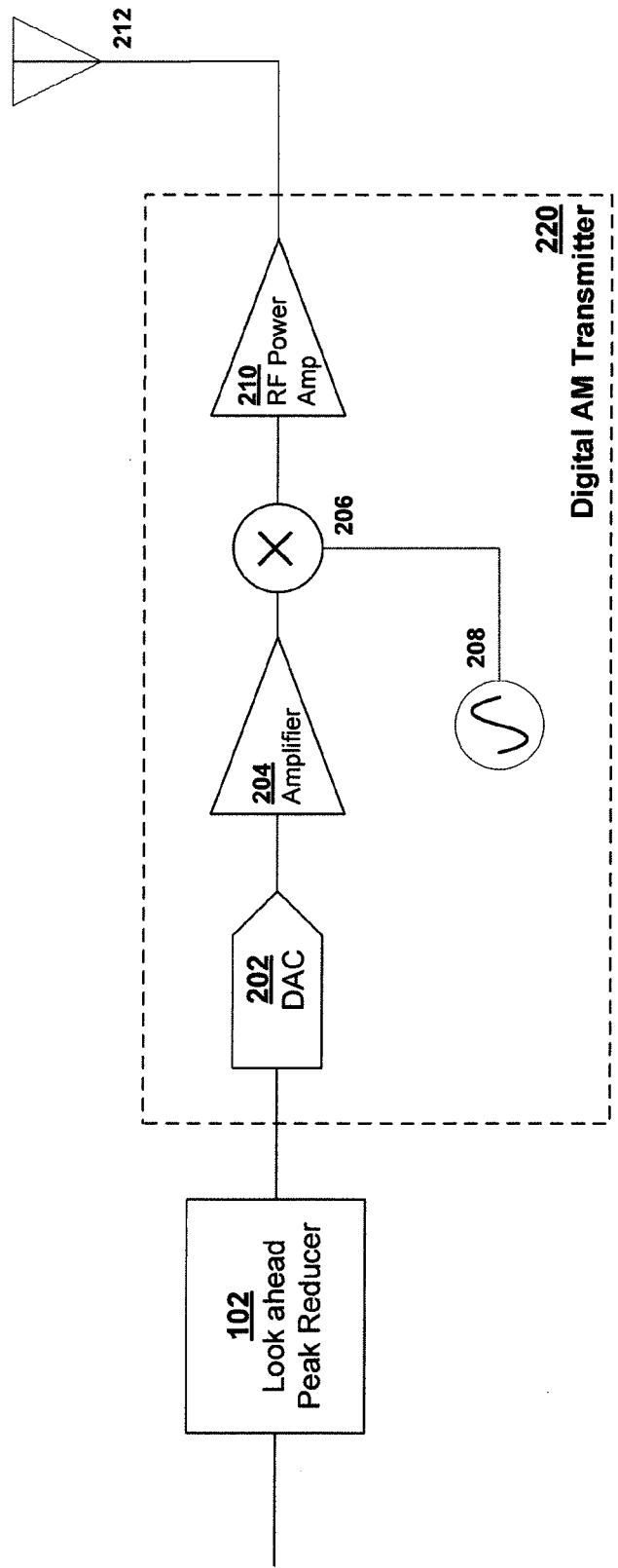
FIG. 2 shows an embodiment of an amplitude modulation (AM) transmitter.

FIG. 2 shows an embodiment of an amplitude modulation (AM) transmitter. Transmitter 200 comprises look-ahead peak reducer 102 and digital AM transmitter 220. Digital AM transmitter comprises DAC 202, amplifier 204, modulator 206, oscillator 208 and RF amplifier 210. DAC 202 receives a digital audio signal and converts the signal to an analog signal which is then amplified by amplifier 204. Modulator 206 modulates the audio signal with a carrier signal generated by oscillator 208. The modulated signal is then amplified by RF driver 210, which drives antenna 212. Digital AM transmitter 220 is susceptible to peak induced distortion in a number of places. For example, an excessive peak in the audio signal can drive amplifier 204 out of the linear region into a saturation region, causing clipping distortion. In another example, excessive negative peaks in the audio signal can cause over-modulation, where the audio signal is lower than the amplitude of the carrier signal. Look-ahead peak reducer 102 can address these peak-induced artifacts by reducing excessive peaks in the audio signal with minimal audible artifacts.

Figure 3:
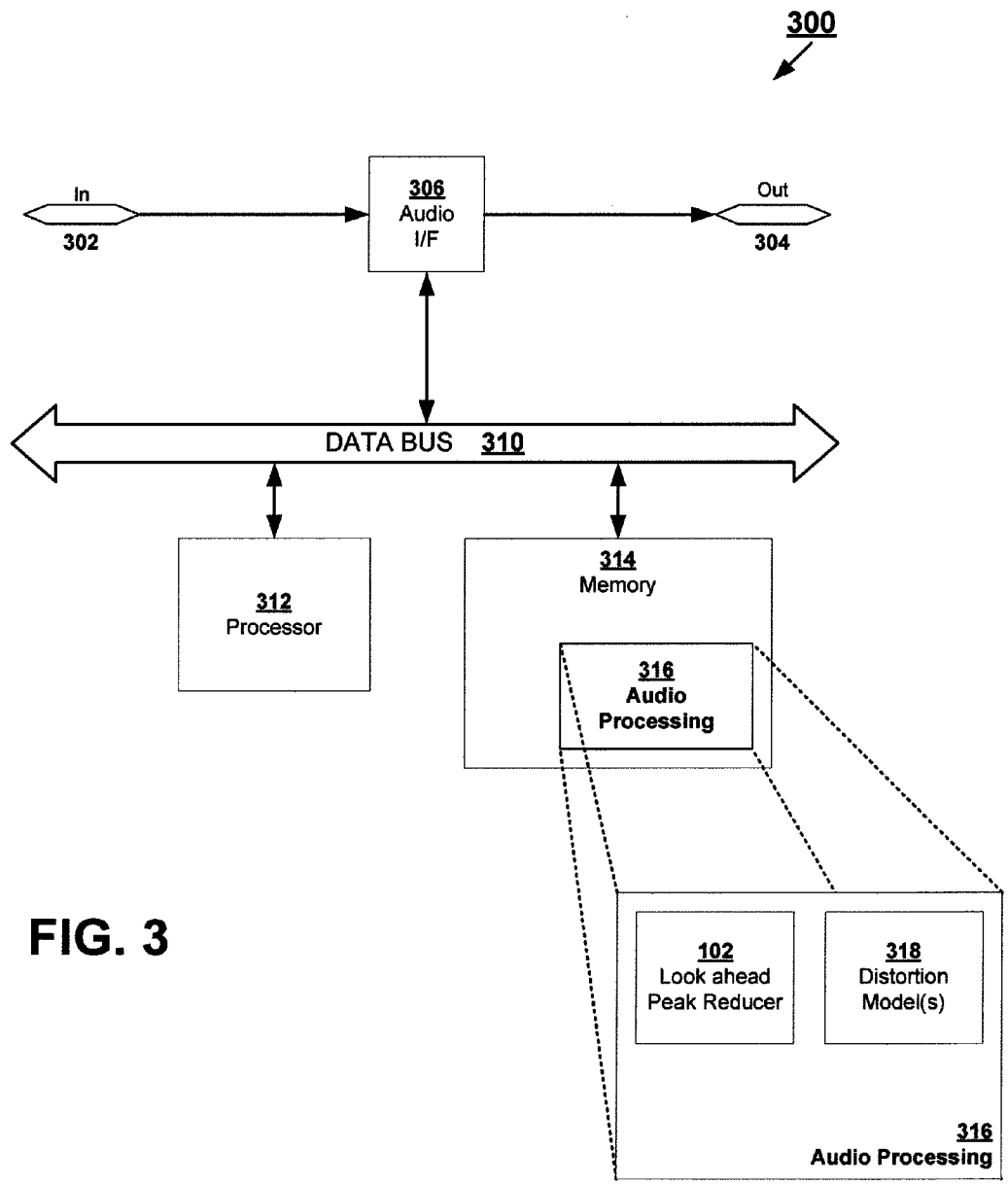
FIG. 3 is a diagram illustrating an embodiment of a digital front end to an audio driver.

FIG. 3 is a diagram illustrating an embodiment of a digital front end to an audio driver. In this implementation, digital front end comprises memory 314, processor 312, and audio interface 306, wherein each of these devices is connected across one or more data buses 310. Although this illustrative embodiment shows an implementation using a separate processor and memory, other embodiments include an implementation purely in software as part of an application, and an implementation in hardware using signal processing components.

Audio interface 306 receives audio input data 302, which can be provided by an application such as a music or video playback application or a cellular telephone receiver, and provides processed digital audio output 304 to the back end of the audio driver, such as backend audio driver 110 in FIG. 1. Processor 312 can include a central processing unit (CPU), an auxiliary processor associated with the audio system, a semiconductor based microprocessor (in the form of a microchip), a macroprocessor, one or more application specific integrated circuits (ASICs), digital logic gates, a digital signal processor (DSP) or other hardware for executing instructions.

Memory 314 can include a suitable combination of volatile memory elements (e.g., random-access memory (RAM) such as DRAM, and SRAM) and nonvolatile memory elements (e.g., flash, read only memory (ROM), or nonvolatile RAM). Memory 314 stores one or more separate programs, each of which includes an ordered listing of executable instructions for implementing logical functions to be performed by processor 312. The executable instructions include instructions for audio processing module 316, including look-ahead peak reducer 102 and optional distortion modules 318, which are described below. Audio processing module 316 can also comprise instructions for performing audio processing operations, such as equalization and filtering. In alternate embodiments, the logic for performing these processes can be implemented in hardware or a combination of software and hardware.

Cellular telephones are especially susceptible to peak induced distortion. Because of the low cost speakers usually employed to keep unit costs down, these speakers are more vulnerable to rub and buzz distortion than more expensive speakers. Additionally it has been observed that some cellular telephone manufactures allow the digital portion of an audio driver to overdrive the analog portion, leading to electrical saturation distortion.

Figure 4:
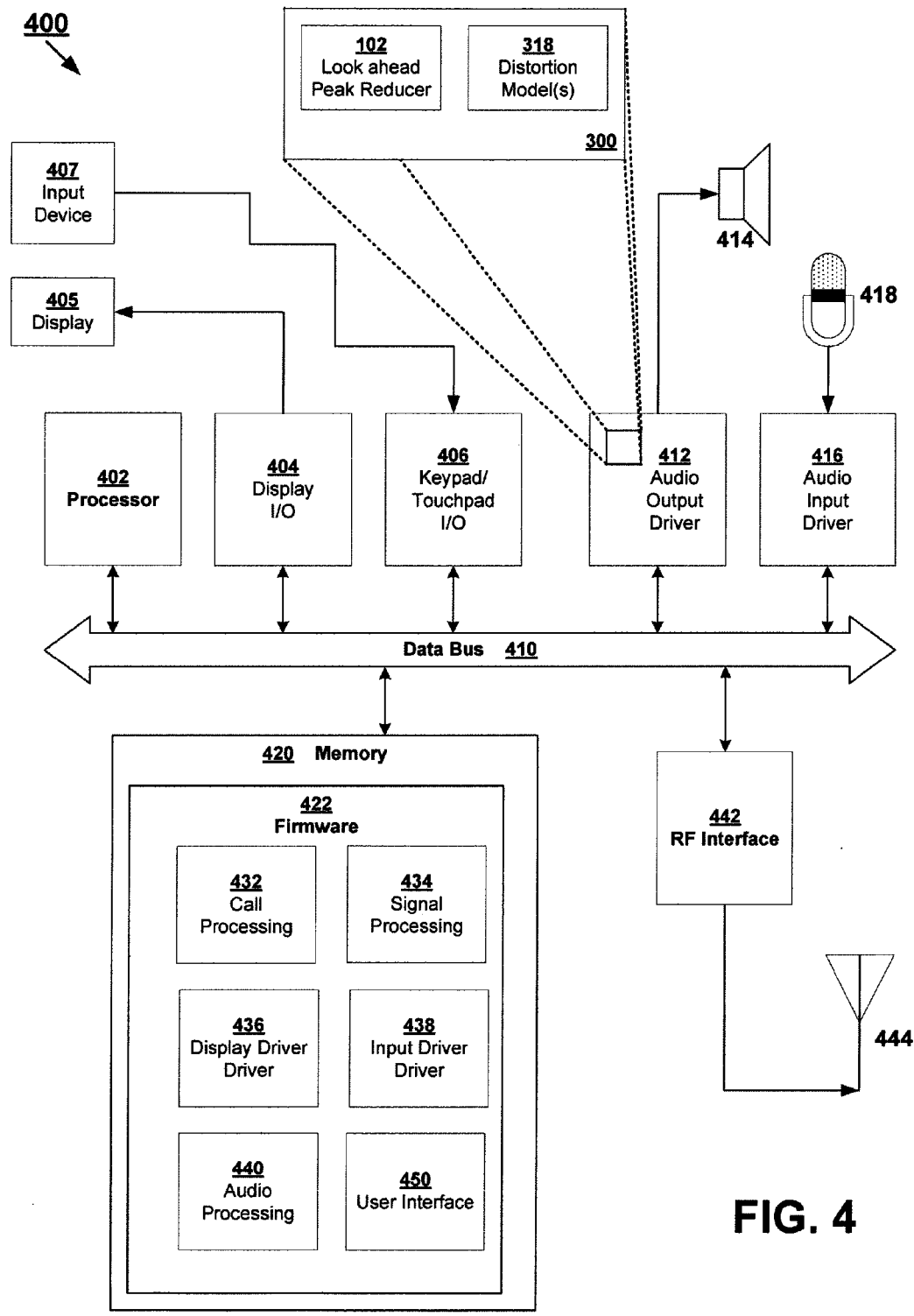
FIG. 4 is an embodiment of a cellular telephone equipped with look-ahead peak reduction to compensate for electrical saturation and mechanical distortion.

FIG. 4 is an embodiment of a cellular telephone equipped with look-ahead peak reduction to compensate for electrical saturation and mechanical distortion. Cellular telephone 400 comprises processor 402, display I/O 404, input I/O 406, audio output driver 412, audio input driver 416, RF interface 442 and memory 420, wherein each of these devices is connected across one or more data buses 410.

Cellular telephone 400 further comprises display 405, which is driven by display I/O 404. Display 405 can be a liquid crystal display (LCD), a light emitting diode (LED) display, or other suitable displays. Cellular telephone 400 further includes input device 407, which communicates to the rest of the cellular telephone through input I/O 406. Input device 407 can be a keypad, keyboard, touch pad or other suitable devices. Cellular telephone 400 further comprises speaker 414, which is driven by audio output driver 412; microphone 418, which drives by audio input driver 416; and antenna 444, which sends and receives RF signals through RF interface 442. Furthermore, audio output driver 412 can include digital portion 300, which includes look-ahead peak reducer 102, and distortion model 318.

Processor 402 can include a CPU, an auxiliary processor associated with the audio system, a semiconductor based microprocessor (in the form of a microchip), a macroprocessor, one or more ASICs, digital logic gates, a DSP or other hardware for executing instructions.

Memory 420 can include a suitable combination of volatile memory elements and nonvolatile memory elements. Memory 420 stores one or more separate programs, each of which includes an ordered listing of executable instructions for implementing logical functions to be performed by the processor 402. The executable instructions include firmware 422 which control and manage many functions of the cellular telephone. The firmware 422 includes call processing module 432, signal processing module 434, display driver 436, input driver 438, audio processing module 440 and user interface 450. Call processing module 432 contains instructions that manage and control call initiation, call termination, and housekeeping operations during a call as well as other call-related features, such as caller id and call waiting. Signal processing module 434 contains instructions that manage the communications between the cellular telephone and remote base stations, including determining signal strength, adjusting transmit strength and encoding of transmitted data. Display driver 436 interfaces between user interface 450 and display I/O 404 so that the appropriate messages, text and annunciators can be displayed on display 405. Input driver 438 interfaces between user interface 450 and input I/O 406, so that user input from input device 407 can be interpreted by user interface 450 and the appropriate actions can take place. User interface 450 controls the interaction between the end user through display 405 and input device 407 and operation of the cellular telephone. For instance, when a phone number is dialed through input device 407, user interface 450 can cause "CALLING" to be displayed on display 405. Audio processing module 440 manages the audio data received from microphone 418 and transmitted to speaker 414. Audio processing module 440 can include such features as volume control and mute functions. In alternate embodiments, the logic for performing these processes can be implemented in hardware or a combination of software and hardware. In addition, other embodiments of a cellular telephone can comprise additional features, such as a Bluetooth interface and transmitter, a camera, and mass storage.

Figure 5:
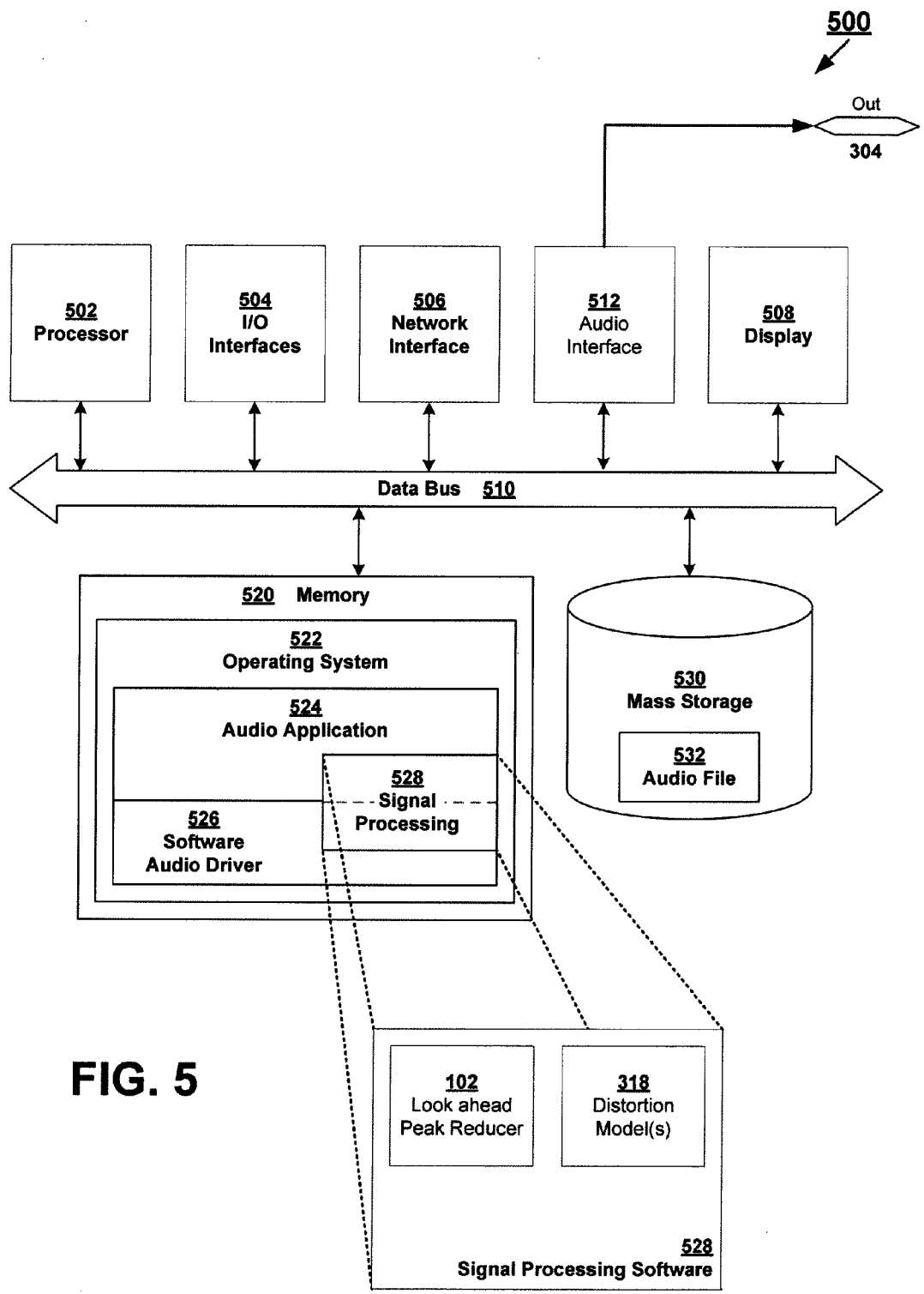
FIG. 5 illustrates an embodiment of a PC equipped with peak reduction audio enhancement.

In another embodiment, if hardware audio drivers are not available for modification, the peak reduction can be implemented in software aboard a personal computer (PC) which is interfaced to a sound card or implemented as an "app" for a smart phone for the playback of sound. FIG. 5 illustrates an embodiment of a PC equipped with peak reduction audio enhancement. Generally speaking, PC 500 can comprise any one of a wide variety of computing devices, such as a desktop computer, portable computer, dedicated server computer, multiprocessor computing device, cellular telephone, PDA, handheld or pen based computer, embedded appliance and so forth. Regardless of its specific arrangement, PC 500 can, for instance, comprise memory 520, processor 502, a number of input/output interfaces 504, and mass storage 530, audio interface 512 for communicating with a hardware audio driver, wherein each of these devices is connected across one or more data buses 510. Optionally, PC 500 can also comprise a network interface device 506 and display 508, also connected across one or more data buses 510.

Processing device 502 can include a CPU, an auxiliary processor associated with the audio system, a semiconductor based microprocessor (in the form of a microchip), a macroprocessor, one or more, digital logic gates, a DSP or other hardware for executing instructions.

Input/output interfaces 504 provide suitable interfaces for the input and output of data. For example, these components may interface with a user input device (not shown), which may be a keyboard or a mouse. In other examples, especially a handheld device (e.g., PDA, mobile telephone), these components may interface with function keys or buttons, a touch sensitive screen, a stylus, etc. Display 508 can be a computer monitor, a plasma screen for a PC, a liquid crystal display (LCD) on a hand held device, or other suitable displays.

Network interface device 506 comprises various components used to transmit and/or receive data over a network environment. By way of example and not by limitation, these can include a device that can communicate with both inputs and outputs, for instance, a modulator/demodulator (e.g., a modem), wireless (e.g., radio frequency (RF)) transceiver, a telephonic interface, a bridge, a router, network card, etc.

Memory 520 can include a suitable combination of volatile memory elements and nonvolatile memory elements. Mass storage 530 can also include nonvolatile memory elements (e.g., flash, hard drive, tape, rewritable compact disc (CD-RW), etc.). Memory 520 comprises software which may include one or more separate programs, each of which includes an ordered listing of executable instructions for implementing logical functions. Often, the executable code can be loaded from nonvolatile memory elements including from components of memory 520 and mass storage 530. Specifically, the software can include native operating system 522, one or more native applications, emulation systems, or emulated applications for any of a variety of operating systems and/or emulated hardware platforms, emulated operating systems, or other suitable platforms. These may further include audio application 524, which can be a stand-alone application, a plug-in or other suitable applications. These may further include software audio driver 526 which is used by applications to communicate with a hardware audio driver. Audio driver 526 can further include signal processing software 528, which can include look-ahead peak reducer 102 and optional distortion model 318. Alternatively, audio application 524 can include signal processing software 528. It should be noted, however, that the logic for performing these processes can also be implemented in hardware or a combination of software and hardware.

Mass storage 530 can be formatted into one of a number of file systems which divide the storage medium into files. These files can include audio files 532 which can hold sound samples such as songs that can be played back. The sound files can be stored in a wide variety of file formats including but not limited to RIFF, AIFF, WAV, MP3 and MP4.

Figure 6:
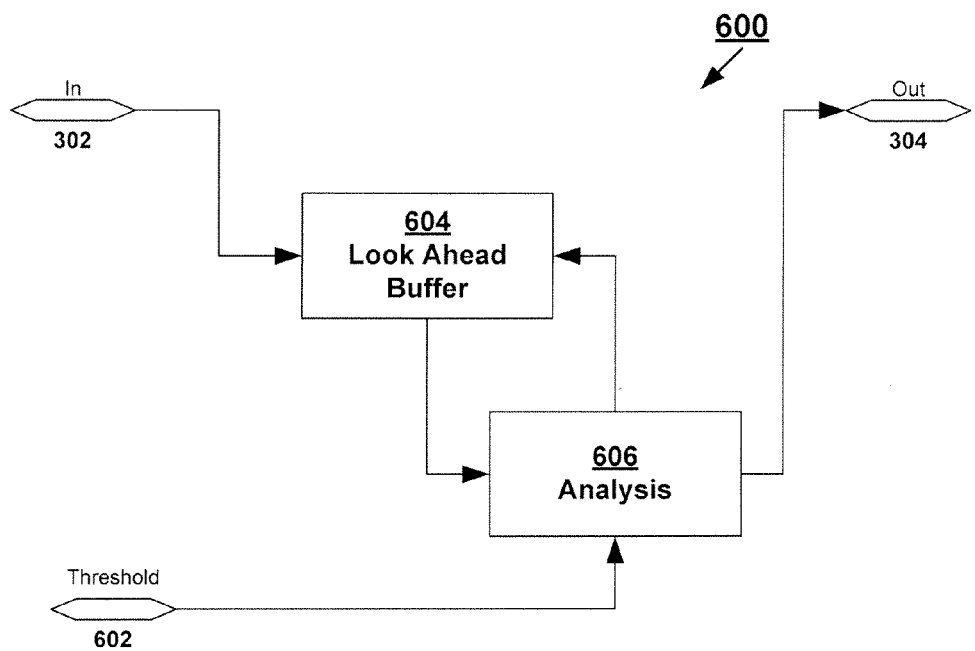
FIG. 6 illustrates an embodiment of a look-ahead peak reducer.

FIG. 6 illustrates an embodiment of a look-ahead peak reducer, including look-ahead buffer 604 and analysis engine 606. Look-ahead buffer 604 stores a number of samples from input 302. W+1 samples are stored in look-ahead buffer. Analysis engine 606 receives one or more threshold values 602 and ensures that the output values sent to output 304 do not exceed the threshold value.

Figure 7:
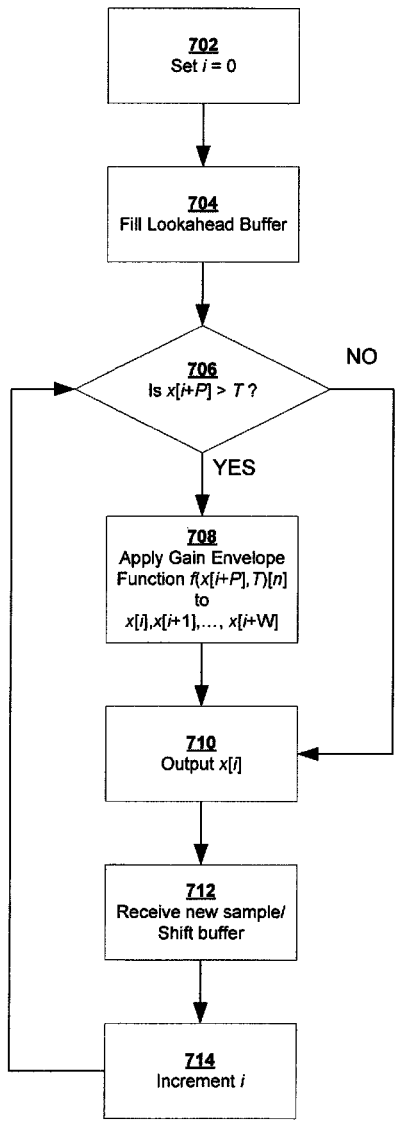
FIG. 7 is a flowchart illustrating an exemplary embodiment of a method employed by the analysis engine.

FIG. 7 is a flowchart illustrating an exemplary embodiment of a method employed by analysis engine 606 to ensure the output values remain below a given threshold. At step 702, an index variable denoted by i is initialized to zero. At step 704, look-ahead buffer 604 filled with W+1 input samples. At step 706, a comparison is made of input sample x[i+P] to threshold T. If x[i+P]>T, then at step 708, a gain envelope function f(x[i+P], T)[n] is applied to all samples in the look-ahead buffer, that is x[i], x[i+1], . . . , x[i+W]. Specifically, each sample x[i+j] is replaced by x[i+j]×f(x[i+P], T)[j] in look-ahead buffer 604. At step 710, x[i] is sent to the output. At step 712, the sample x[i] is removed from the look-ahead buffer and sample x[i+W+1] is added to the look-ahead buffer so the look-ahead buffer now holds samples x[i+1], x[i+2], . . . , x[i+W], x[i+W+1]. At step 714, the index variable i is incremented. The process can then repeat at step 706.

At step 706, it was assumed that the threshold T was an upper limit. However, equivalently, the method can be applied to a lower limit as well, in which case step 606 would determine whether x[i+P]<T. The look-ahead index P is a predetermined number between 0 and W. In one embodiment, P is chosen at the midpoint between 0 and W. Analysis engine 606 looks ahead by P samples to determine how much to attenuate the signal, if at all. As a net result, there is a delay of W samples, so the choice of W should be small enough so that the delay is not significantly perceivable.

Figure 8:
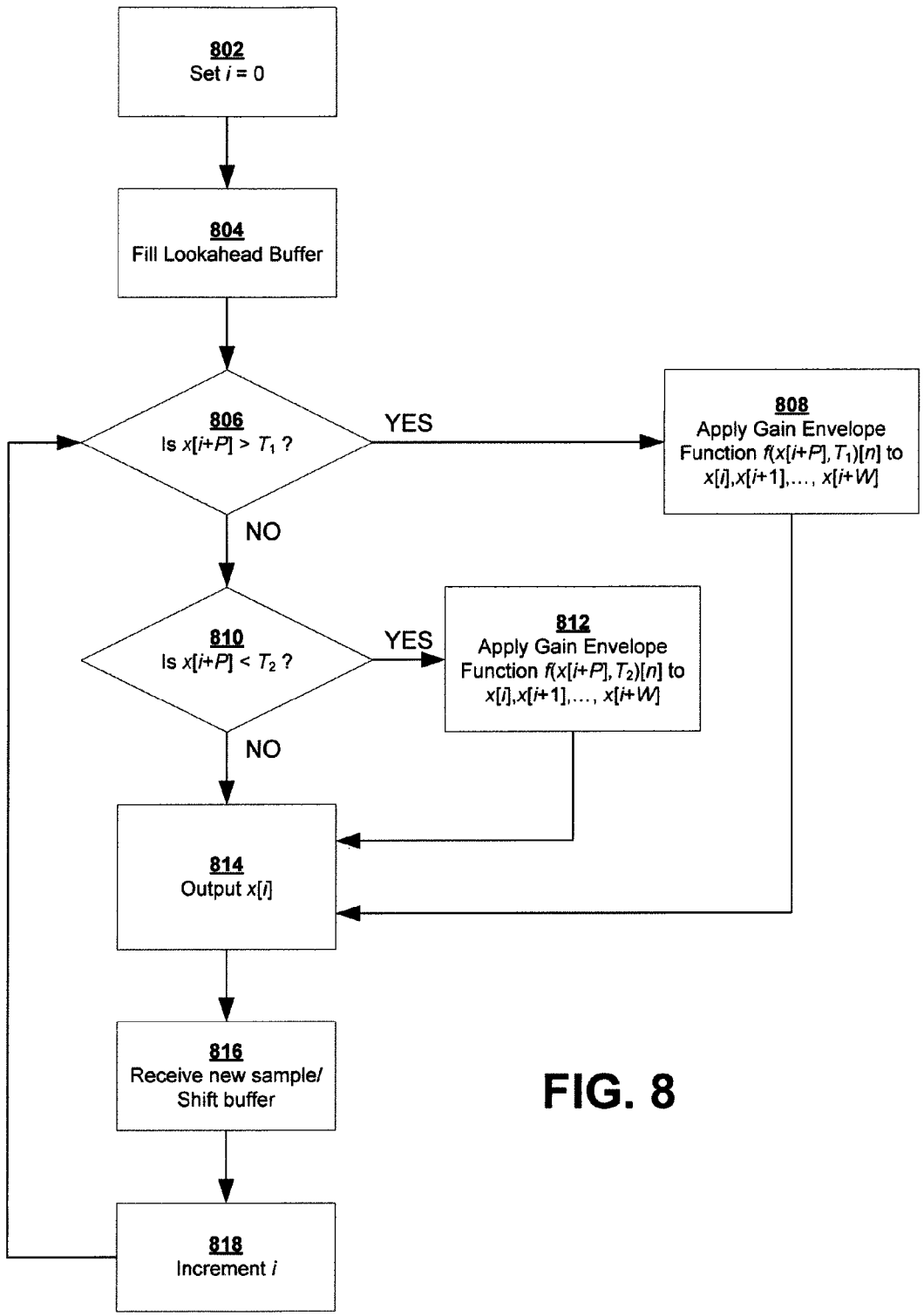
FIG. 8 is a flowchart illustrating an exemplary embodiment of the method employed by another embodiment of the analysis engine.

FIG. 8 is a flowchart illustrating an exemplary embodiment of the method employed by another embodiment of analysis engine 606 which receives an upper limit threshold $T_1$ and a lower limit threshold $T_2$. At step 802, an index variable denoted by i is initialized to zero. At step 804, look-ahead buffer 602 is filled with W+1 input samples. At step 806, a comparison is made of input sample x[i+P] is compared to upper threshold, $T_1$. If x[i+P]>$T_1$, then at step 808, a gain envelope function f(x[i+P], $T_1$)[n] is applied to all samples in the look-ahead buffer, that is x[i], x[i+1], . . . , x[i+W]. Otherwise at step 810, a comparison is made of input sample x[i+P] is compared to lower threshold, $T_2$. If x[i+P]<$T_2$, then at step 812, a gain envelope function f(x[i+P], $T_2$)[n] is applied to all samples in the look-ahead buffer, that is x[i], x[i+1], . . . , x[i+W]. At step 814, x[i] is sent to the output. At step 816, the sample x[i] is removed from the look-ahead buffer and sample x[i+W+1] is added to the look-ahead buffer so the look-ahead buffer now holds samples x[i+1], x[i+2], . . . , x[i+W], x[i+W+1]. At step 818, the index variable i is incremented. The process can then repeat at step 806.

In the special case where $T_1 = -T_2$, steps 806 and 810 can be combined into a single test where |x[i+P]| is compared to $T_1$. If |x[i+P]|>$T_1$, then the appropriate gain envelope function can be applied to all samples in the look-ahead buffer.

Figure 9:
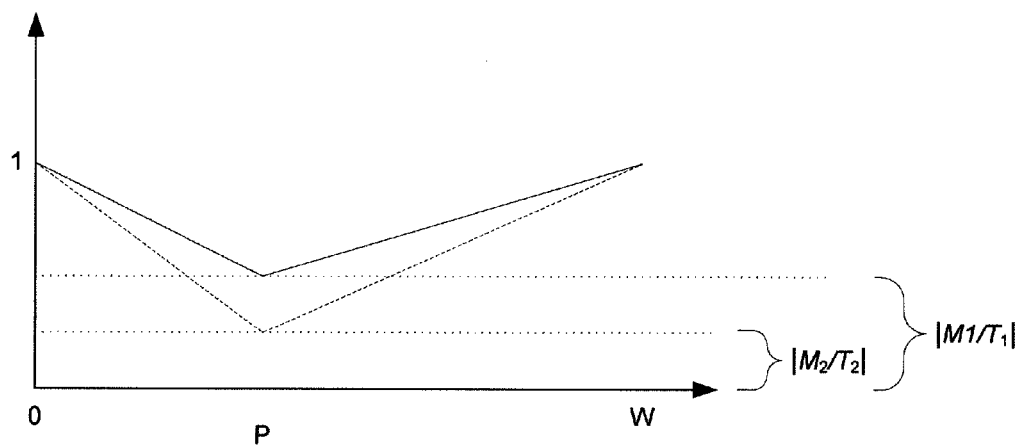
FIG. 9 illustrates desirable characteristics in a gain envelope function.

At steps 708, 808 and 812, f denotes a parameterized family of functions. For different values of M and T, f yields a different gain envelope function which is a function of n. As illustrated in FIG. 9, the desired characteristics of this family of functions is f(M,T)[0]=1, f(M,T)[W]=1, and $$f(M, T)[P] = \left|\frac{T}{M}\right|.$$

Another desirable characteristic of functions in the family of functions is that they are monotonic between 0 and P and between P and W. For example, the functions shown in FIG. 9 monotonically decrease between 0 and P increase monotonically between P and W. FIG. 9 shows two examples of gain envelope functions for different values of M and T.

Figure 10:
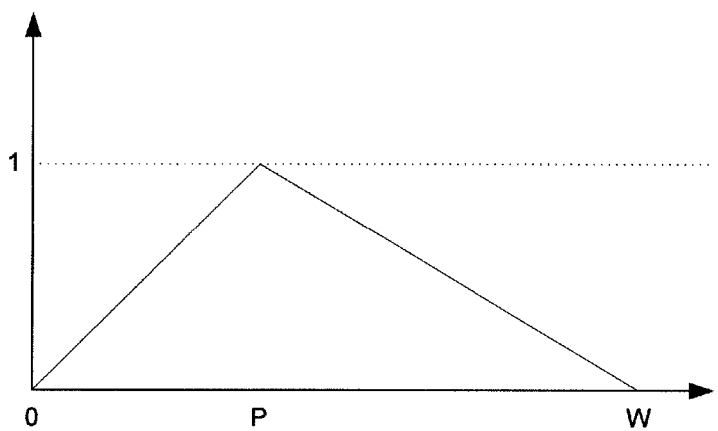
FIG. 10 shows an example of a basis function for generating a family of gain envelope functions.

One method to construct a family of functions is to build a family of gain envelope functions from a basis function. The characteristics of a basis function $g$ are that $g[0]=0$, $g[P]=1$, and $g[W]=0$. It is also desirable though not required that $g$ be monotonically increasing between 0 and P and monotonically decreasing between P and W. An example is shown in FIG. 10, which is a piecewise linear basis function. The family of gain envelope functions is derived by the equation (1).

$$f(M, T)[n] = 1 - \left(1 - \left|\frac{T}{M}\right|\right)g[n] \qquad (1)$$

Because $g[0]=0$ then f(M,T)[0]=1; because $g[P]=1$ then $$f(M, T)[P] = \left|\frac{T}{M}\right|$$

and because g[W]=0, then $g$(M,T)[W]=1, meeting the desired characteristics for the family of gain envelope functions. Furthermore, if g is monotonic between 0 and P and between P and W, then θ(M,T) is monotonic between 0 and P and between P and W.

In another embodiment it may be desirable to apply a gain to samples in the window, so a new constraint of f(M,T)[0]=G, f(M,T)[W]=G may be used while maintaining $$f(M, T)[P] = \left|\frac{T}{M}\right|.$$

Equation (1) can be modified as a method of generating this new family of gain envelope functions as described in equation (2).

$$f(M, T)[n] = G - \left(G - \left|\frac{T}{M}\right|\right)g[n] \qquad (2)$$

By introducing the gain term with a non-zero gain in dB, low-level signal intervals can be amplified.

It should be emphasized that though a basis function is a convenient and efficient way to generate a family of gain envelope functions, it is by no means the only way nor does it is cover all possible family of gain envelope functions. Other suitable gain envelope functions and methods can be used generate those families.

Figure 11A:
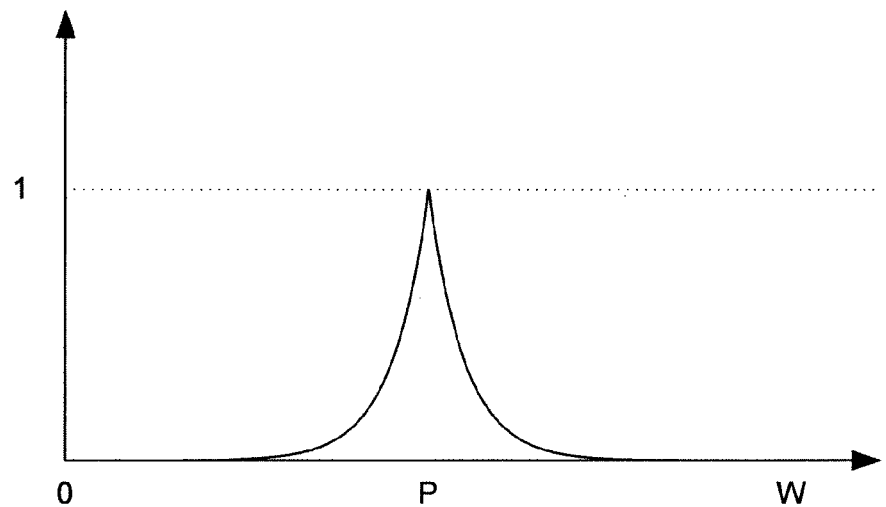
FIGS. 11A-D show other examples of basis functions which can be used to generate a family of gain envelope functions.
Figure 11B:
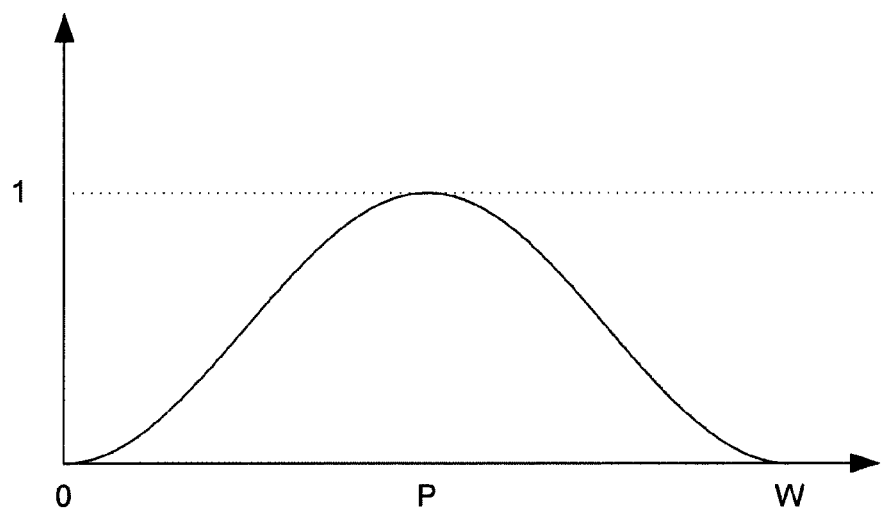
Figure 11C:
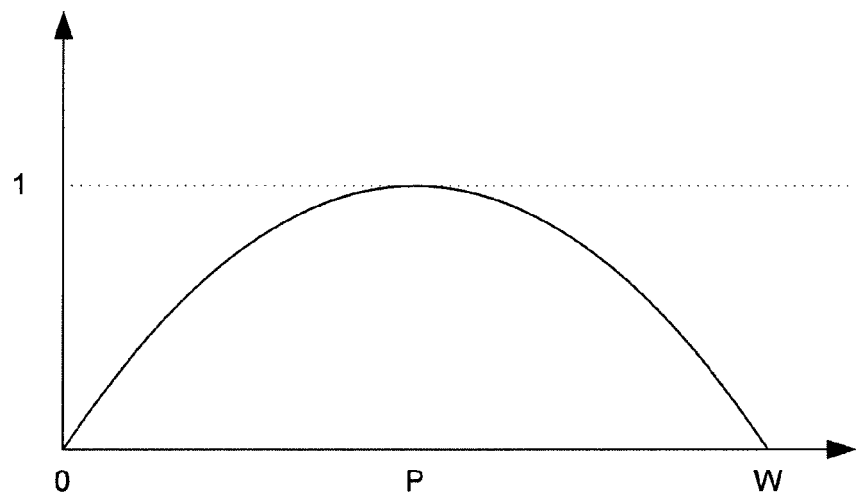
Figure 11D:
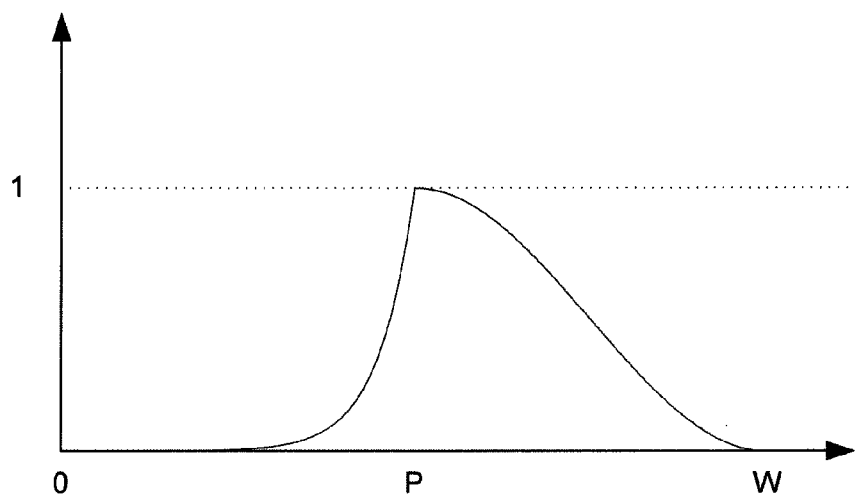

FIGS. 11A-D show other examples of basis functions which can be used to generate a family of gain envelope functions. FIG. 11A is a piecewise linear basis function in dBs that is linear when viewed on a logarithmic scale. FIG. 11B is an example of a window function used as a basis function. FIG. 11C is an example of using a Hamming window function as a basis function. Finally, FIG. 11D is an example of a basis function which does not have any symmetry between its increasing portion and its decreasing portion.

Another variant of the parameterized family of gain functions is to use more than one sample in the look-ahead buffer to define the gain function. More specifically, the gain applied to all samples in the look-ahead buffer is a function f(x[i], x[i+1], x[i+W], T). An example of such a gain envelope function is given by equation (2).

$$f(x[i], x[i+1], \ldots, x[i+W], T)[n] = 1 - \left(1 - \left|\frac{T}{M}\right|\right)g[n], \text{ where} \quad (3)$$

$$M = \sqrt{\sum_{k=0}^{W} \frac{x^2[i+k]}{W+1}} \_\text{or}\_ M = \sum_{k=0}^{W} \frac{|x[i+k]|}{W+1}$$

In this example, the gain function can be used to control the power of a signal.

Figure 26:
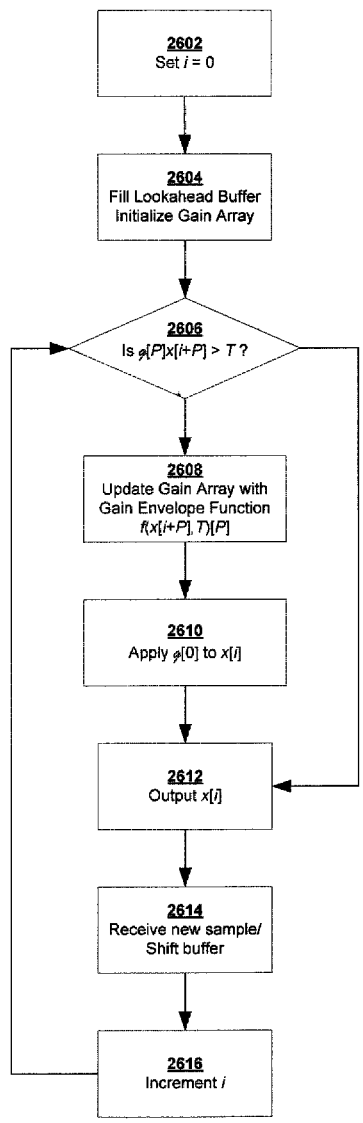
FIG. 26 is a flowchart illustrating an exemplary embodiment of a method employed by analysis engine.

FIG. 26 is a flowchart illustrating an exemplary embodiment of a method employed by analysis engine 606. At step 2602 an index variable denoted by i is initialized to zero. At step 2604, look-ahead buffer 604 is filled with P+1 input samples and gain array $g$ is initialized with W+1 values of 0 dB. At step 2606, a comparison is made of input sample x[i+P] to threshold T. However, unlike in previously, the comparison is made considering the gain $g$[P]. If $g$[P]x[i+P]>T, then at step 2608, the gain array is updated by applying a gain envelope function f(x[i+P], T), where the application of the gain envelope function may be multiplicative if the gain array uses a linear scale and additive if the gain array uses a dB scale. At step 2610, the first value in the gain array $g$[0] is applied to the first sample in the look-ahead buffer, that is x[i]. At step 2612, x[i] is sent to the output. At step 2614, the sample x[i] is removed from the look-ahead buffer and sample x[i+P+1] is added to the look-ahead buffer so the look-ahead buffer now holds samples x[i+1], x[i+2], ..., x[i+P], x[i+P+1]. Also, the gain value $g$[0] is removed from the gain array and a 0 dB value is added to the other end of the gain array. At step 2616, the index variable i is incremented. The process can then repeat at step 2606. The method described in this flow chart can be used when the look-ahead peak reducer is used as a dynamic range compression system to control the output power of an audio system.

The embodiments and implementations previously described work well in addressing electrical saturation issues that can arise when signals exceed a threshold. However, mechanical restriction issues introduce additional complications. Unlike electrical saturation where the threshold is imposed on the signal itself, mechanical restrictions are imposed on the speaker displacement, which is a derived variable based on the signal. Generally speaking, the problem is to apply selective attenuation to an input signal in order to maintain a derived variable below (or above) a predetermined threshold. Mathematically, if the derived variable is given as d[n], then the statement can be expressed as applying attenuation to x[n] to keep d[n] less than T.

Figure 12:
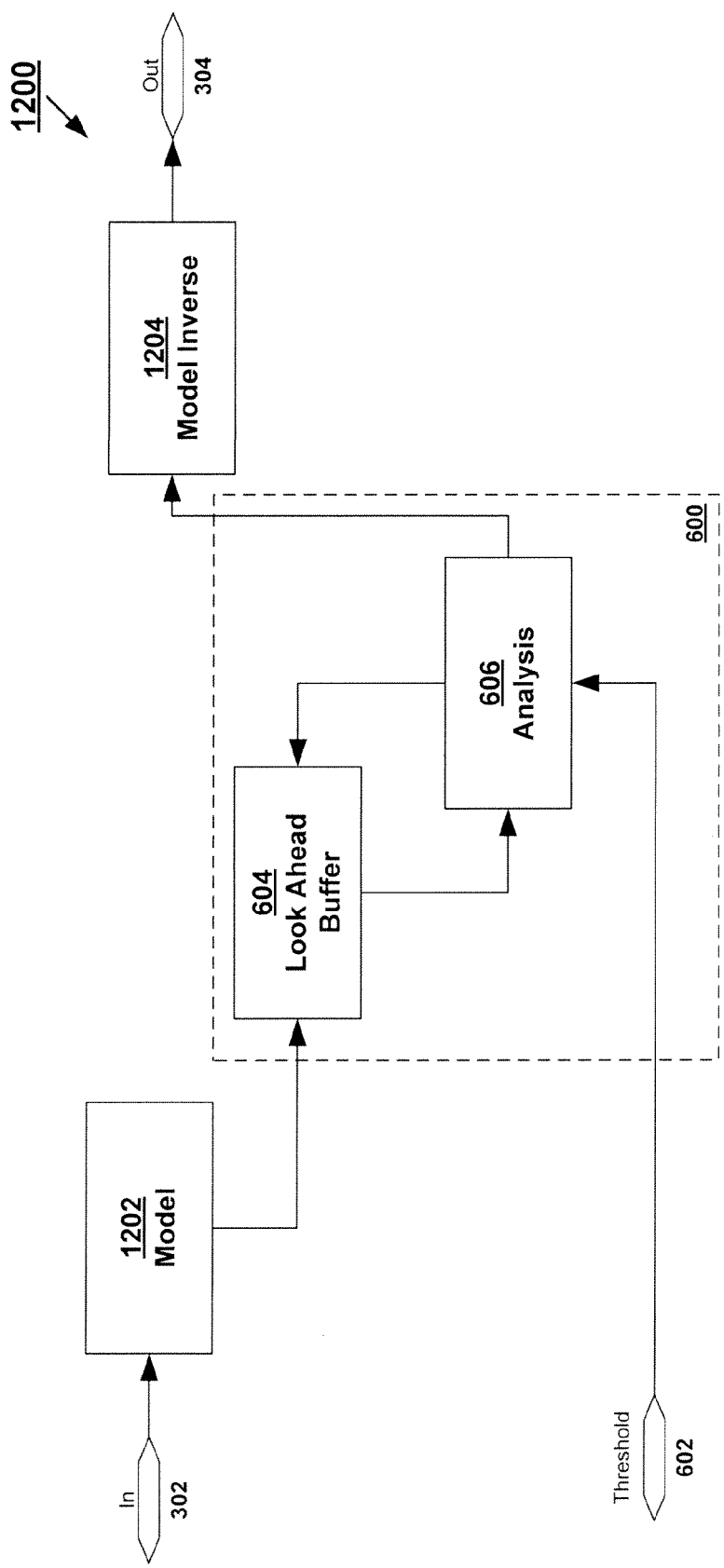
FIG. 12 shows an embodiment of a look-ahead peak reduction system applied to an audio signal using a displacement model.

FIG. 12 shows an embodiment of a look-ahead peak reduction system applied to an audio signal using a displacement model. System 1200 comprises displacement model 1202, look-ahead buffer 604, analysis engine 606 and a model inverse 1204. Look-ahead buffer 604 and analysis engine 606 form look-ahead peak reduction system 600 which rather than reducing the peak on input audio signal 302 reduces the peaks on a displacement signal generated by displacement model 1202 based on the input audio signal. Peak reduction on the displacement signal operates in the same fashion as described above except that the input and output is not the audio signal but the displacement signal as modeled by displacement model 1202. The peak reduced output displacement signal is then converted back to an audio signal by model inverse 1204.

Displacement is often modeled by an infinite impulse response (IIR) filter. With a well defined transfer function, an inverse transfer function can easily be computed. However, the inverse transfer function can pose several practical challenges. First, the inverse model may no longer be causal (i.e., requiring future input values). To overcome the first obstacle where future values are not known, a look-ahead of a few samples can be used. Since look-ahead peak reduction system 600 already causes a modest delay, the even smaller delay caused by a non-causal inverse model would be negligible. Another issue is the stability of the inverse transfer function. Depending on the model used, the model inverse could be unstable. Fortunately, there are optimal inverse filters which can provide an accurate approximation to an inverse filter across a frequency range and maintain stability. The accuracy of these optimal inverse filters can also depend on the model used.

Figure 13:
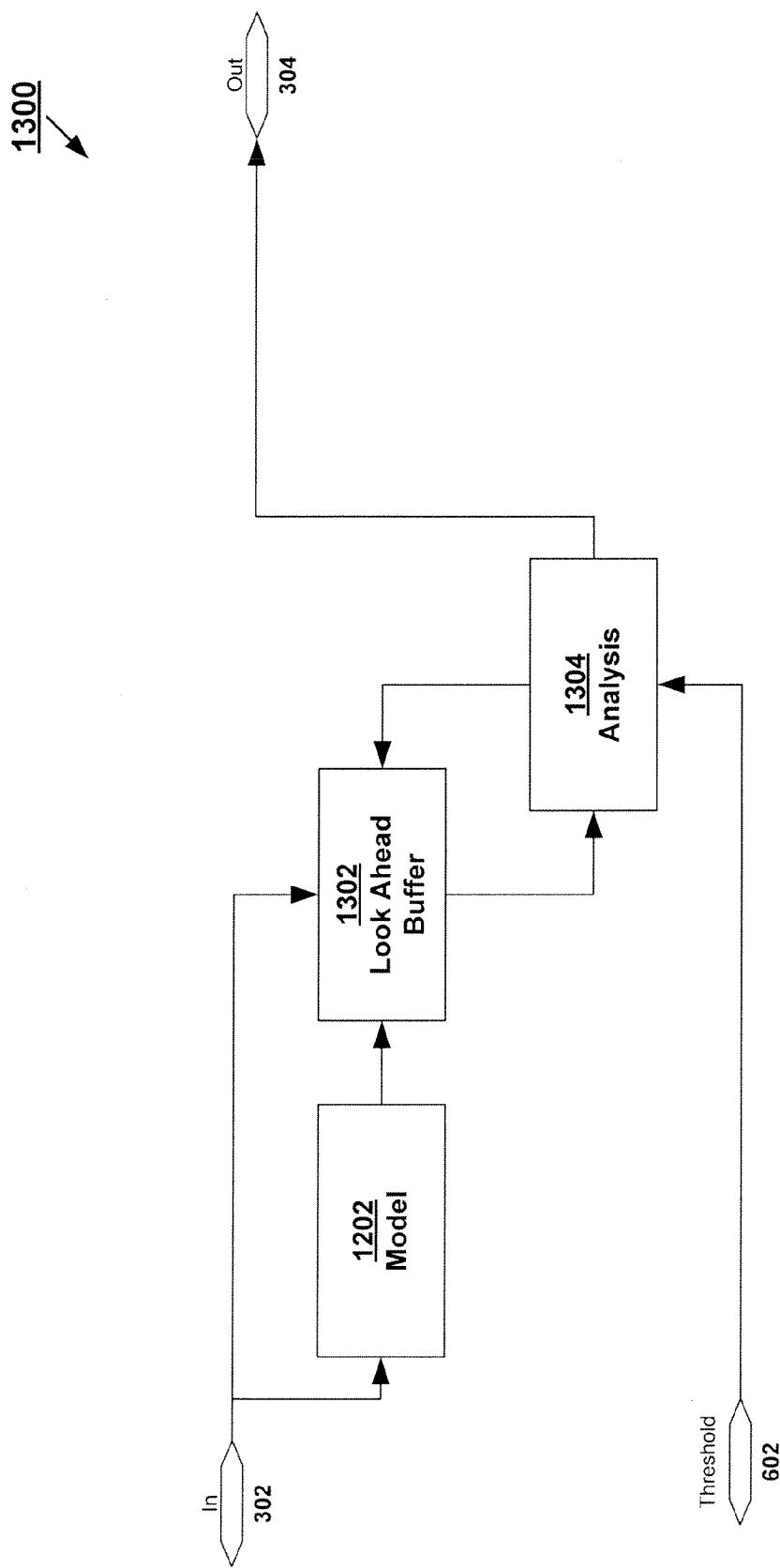
FIG. 13 shows another embodiment of a look-ahead peak reduction system applied to an audio signal using a displacement model without the use of a model inverse.

FIG. 13 shows another embodiment of a look-ahead peak reduction system applied to an audio signal using a displacement model without the use of a model inverse. Because of potential stability or causality problems with an inverse filter or simply because of the computational complexity a model inverse could cause, a model inverse is not always desirable or practical. Look-ahead peak reduction system 1300 comprises displacement model 1202, look-ahead buffer 1302 and analysis engine 1304. Unlike previously described look-ahead buffers, look-ahead buffer 1302 stores W+1 samples of both input signal 302 and W+1 samples of the displacement signal generated by model 1202, that is, x[i], x[i+1], ..., x[i+W] and d[i], d[i+1], ..., d[i+W], where d[k] is the displacement corresponding to input sample x[k]. Analysis engine 1304 operates in a similar fashion to analysis engine 606 except the displacement signal is used as a guide to attenuate the input signal.

Figure 14:
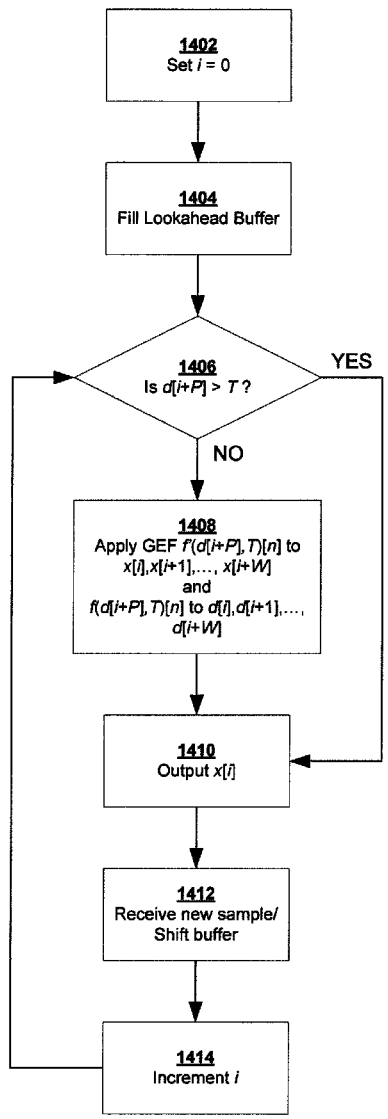
FIG. 14 is a flowchart illustrating an exemplary embodiment of a method employed by the analysis engine.

FIG. 14 is a flowchart illustrating an exemplary embodiment of a method employed by analysis engine 1304 to ensure the output values remain below a given threshold. At step 1402, an index variable denoted by i is initialized to zero. At step 1404, look-ahead buffer 1302 is filled with W+1 input samples and W+1 displacement samples. At step 1406, a comparison is made of displacement sample d[i+P] to threshold T. If d[i+P]>T, then at step 1408, a gain envelope function f(d[i+P], T)[n] is applied to all displacement samples in the look-ahead buffer, that is, d[i], d[i+1], ..., d[i+W] and a gain envelope function f'(d[i+P], T)[n] is applied to all input samples in the ahead buffer, that is, x[i], x[i+1], ..., x[i+W]. Each sample d[i+j] is replaced by d[i+j]×f(d[i+P], T)[j] and x[i+j] is replaced by x[i+1]×f'(d[i+P], T)[j] in look-ahead buffer 1302. At step 1410, x[i] is sent to the output. At step 1412, the sample x[i] is removed from the look-ahead buffer and sample x[i+W+1] is added to the look-ahead buffer so the look-ahead buffer now holds samples x[i+1], x[i+2], ..., x[i+W], x[i+W+1]. In addition, the sample d[i] is removed from the look-ahead buffer and sample d[i+W+1] is added to the look-ahead buffer so the look-ahead buffer now holds samples d[i+1], d[i+2], ..., d[i+W], d[i+W+1]. At step 1414, the index variable i is incremented. The process can then repeat at step 1406.

Once again, at step 1406, it was assumed that the threshold T was an upper limit. However, equivalently, the method can be applied to a lower limit as well. Furthermore, because the audio signal and the displacement signal are not merely a scaled copy of each other, attenuation of the audio signal by the same gain as that applied to the displacement signal to fall below the threshold does not guarantee the threshold output audio signal will not cause mechanical distortion. Hence, a related gain envelope family of functions can be used. In the simplest case f'=f, however, by introducing a linear factor, f' and f can still have a simple relationship while maintaining the flexibility to address the discrepancy between the gain need to prevent mechanical distortion and the gain factor determined by comparing the displacement to the threshold. Mathematically, such an example can be expressed as f'(M, T)=f($\alpha$M,T) where $\alpha$ is a predetermined constant.

Figure 15:
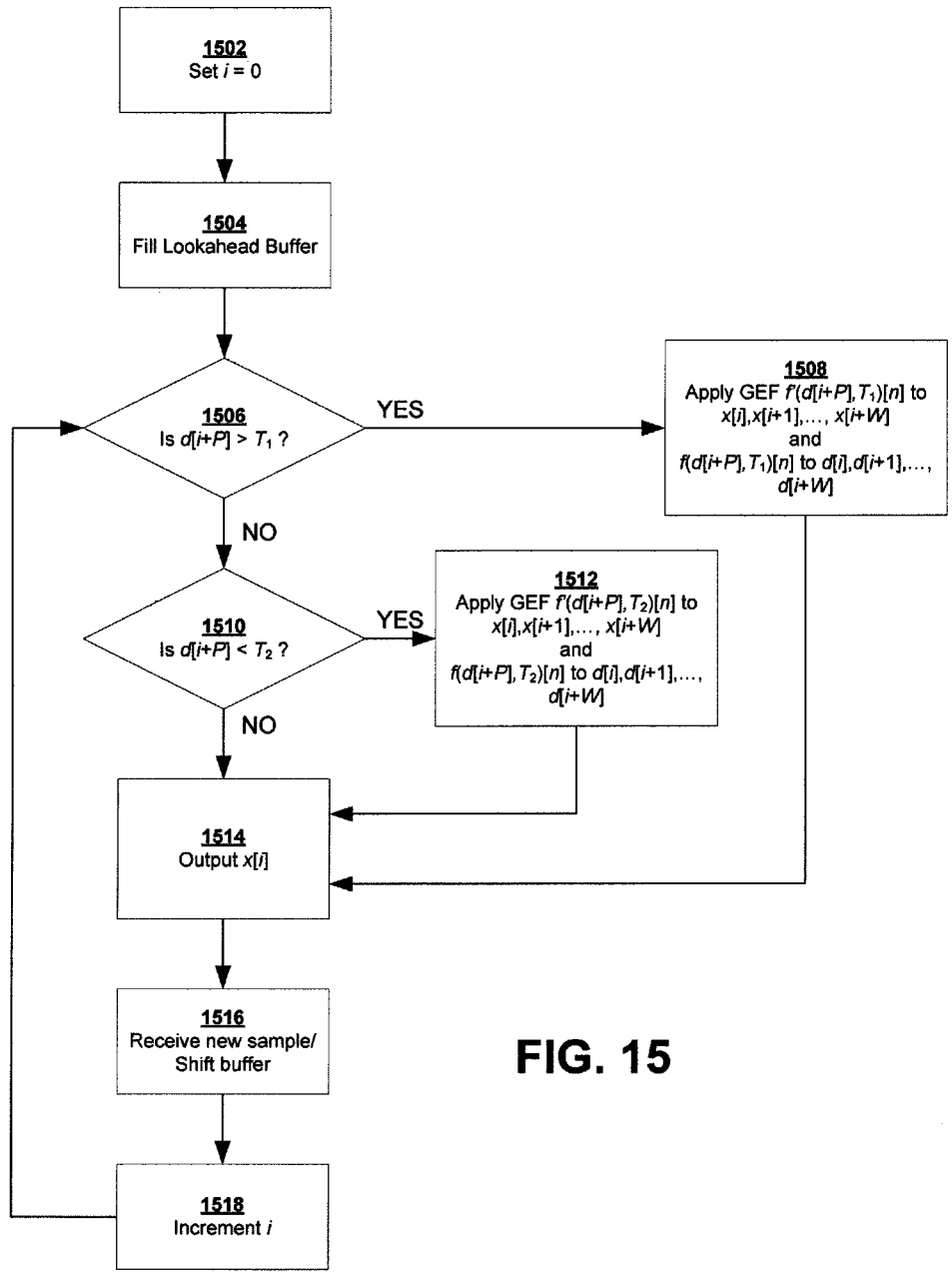
FIG. 15 is a flowchart illustrating an exemplary embodiment of the method employed by another embodiment of the analysis engine.

FIG. 15 is a flowchart illustrating an exemplary embodiment of the method employed by another embodiment of analysis engine 1304 which receives an upper limit threshold $T_1$ and a lower limit threshold $T_2$. At step 1502 an index variable denoted by i is initialized to zero. At step 1504, look-ahead buffer 1302 is filled with W+1 input samples and W+1 displacement samples. At step 1506, a comparison is made of input sample d[i+P] is compared to upper threshold, $T_1$. If d[i+P]>$T_1$, then at step 1508, a gain envelope function f(d[i+P], $T_1$)[n] is applied to all displacement samples in the look-ahead buffer, that is d[i], d[i+1], . . . , d[i+W] and a gain envelope function f'(d[i+P], $T_1$)[n] is applied to all input samples in the look-ahead buffer, that is x[i], x[i+1], . . . , x[i+W]. Specifically, each sample d[i+j] is replaced by d[i+j]×f(d[i+P], T)[j] and x[i+j] is replaced by x[i+j]×f'(d[i+P], T)[j] in look-ahead buffer 1302. Otherwise at step 1510, a comparison is made of input sample x[i+P] is compared to lower threshold, $T_2$. If x[i+P]<$T_2$, then at step 1512, a gain envelope function f(d[i+P], $T_2$)[n] is applied to all displacement samples in the look-ahead buffer, that is d[i], d[i+1], . . . , d[i+W] and a gain envelope function f'(d[i+P], $T_2$)[n] is applied to all input samples in the look-ahead buffer, that is x[i], x[i+1], . . . , x[i+W]. At step 1514, x[i] is sent to the output. At step 1516, the sample x[i] is removed from the look-ahead buffer and sample x[i+W+1] is added to the look-ahead buffer so the look-ahead buffer now holds samples x[i+1], x[i+2], . . . , x[i+W], x[i+W+1]. In addition the sample d[i] is removed from the look-ahead buffer and sample d[i+W+1] is added to the look-ahead buffer so the look-ahead buffer now holds samples d[i+1], d[i+2], . . . , d[i+W], d[i+W+1]. At step 1518, the index variable i is incremented. The process can then repeat at step 1506.

Once again a family of gain envelope functions f' is applied to the input samples x[j] which is related to the family of gain envelope functions f which is applied to displacement samples d[j]. The relationship between f' and f is described above.

In the special case where $T_1$=$T_2$, steps 1506 and 1510 can be combined into a single test where |d[i+P]| is compared to $T_1$. If |d[i+P]|>$T_1$, then the appropriate gain envelope function can be applied to all input samples and all displacement samples in the look-ahead buffer.

In some audio environments, both mechanical distortion and electrical saturation need to be addressed. While reducing mechanical distortion such as rub and buzz distortion rely on limiting the speaker displacement, reducing electrical saturation distortion relies on limiting the audio signal.

Figure 16:
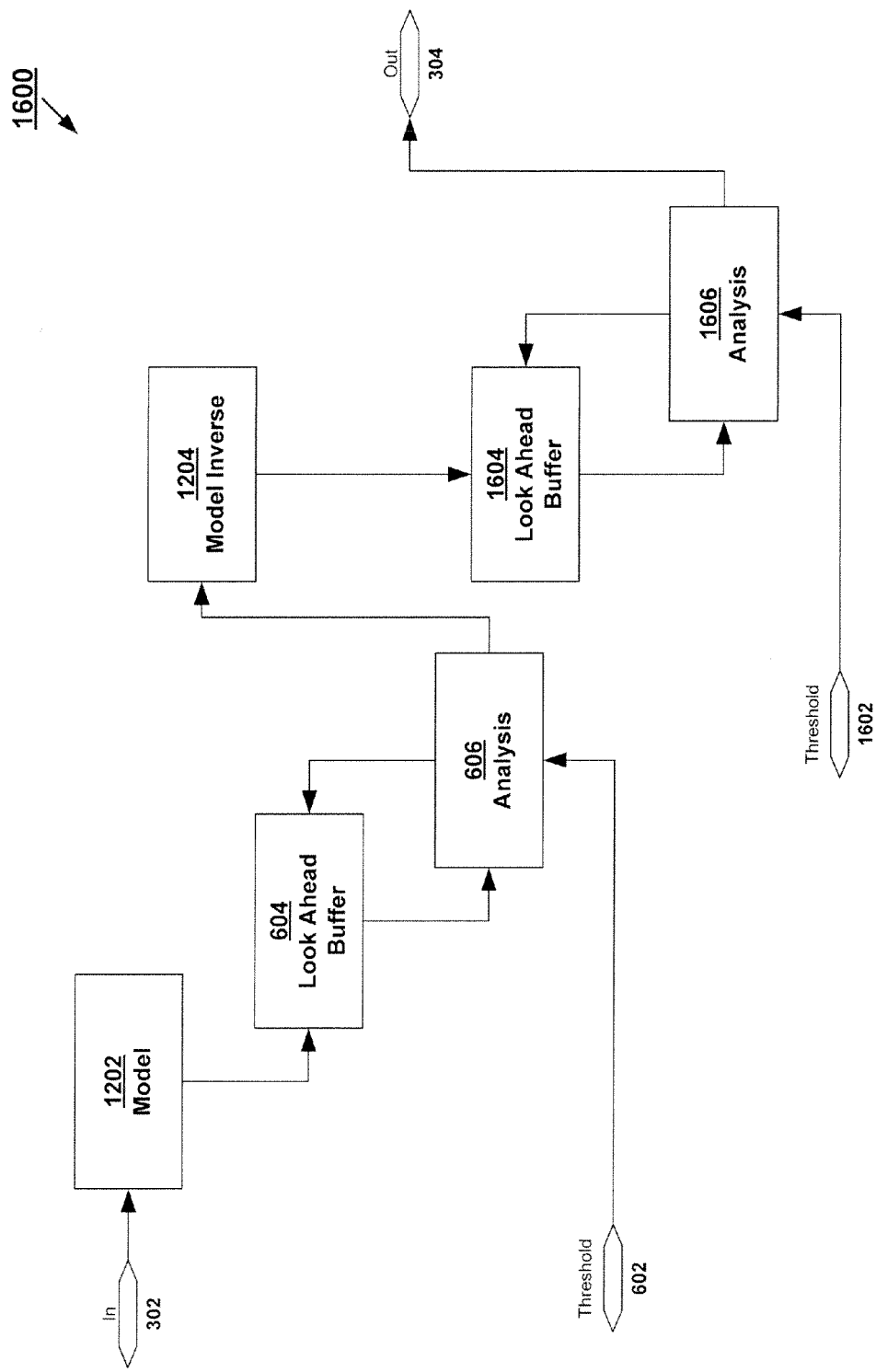
FIG. 16 shows an embodiment of a peak reduction system for limiting both electrical saturation distortion and mechanical distortion.

FIG. 16 shows an embodiment of a peak reduction system for limiting both electrical saturation distortion and mechanical distortion. System 1600 comprises two peak reduction systems, the first comprises model 1202, look-ahead buffer 604, analysis engine 606 and model inverse 1204 and functions in similar manner to that described for system 1200. The second system comprises look-ahead buffer 1604 and analysis engine 1606 and receives threshold 1602. The second system functions analogously to system 600. The first peak reduction system reduces peaks based on the displacement signal generated by model 1202. The second peak reduction system reduces any residual peaks in the audio signal by comparing the audio signal to threshold 1602. The first peak reduction system ensures that mechanical distortion is avoided and the second peak reduction system ensures electrical saturation distortion is avoided. Whenever the first peak reduction system suppresses a peak sufficiently to avoid electrical saturation distortion, the second peak reduction system does not need to do anything. It should be noted that though the resultant output signal may not be precisely the same, the order in which the two peak reduction systems are cascaded can be reversed and still maintain an output signal that would avoid mechanical distortion and electrical saturation distortion.

Figure 17:
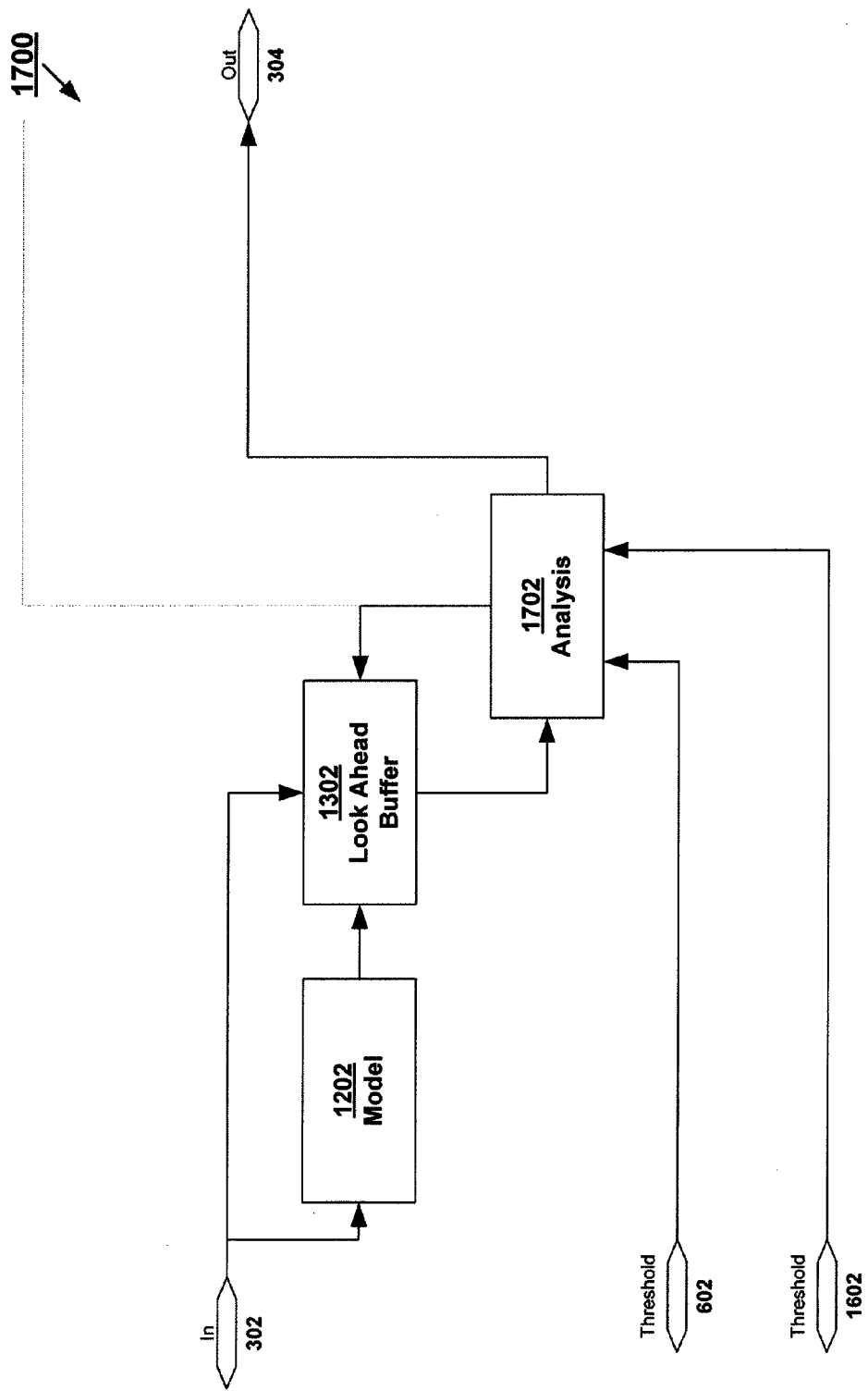
FIG. 17 shows an embodiment of a peak reduction system for limiting both electrical saturation distortion and mechanical distortion.

FIG. 17 shows an embodiment of a peak reduction system for limiting both electrical saturation distortion and mechanical distortion. System 1700 comprises model 1202, look-ahead buffer 1302 and analysis engine 1702. Analysis engine 1702 receives displacement threshold value(s) 602 and signal threshold value(s) 1602. Once again, look-ahead buffer 1302 stores W+1 samples of both input signal 302 and W+1 samples of the displacement signal generated by model 1202, that is x[i], x[i+1], . . . , x[i+W] and d[i], d[i+1], . . . , d[i+W], where d[k] is the displacement corresponding to input sample x[k]. In overview, analysis engine 1702 compares threshold value(s) 602 with d[k] and threshold value(s) 1602 with x[k].

For the sake of generality, in the example shown, it is assumed that both upper and lower threshold values ($T_1$ and $T_2$, respectively) are used for displacement samples and upper and lower threshold values ($T_3$ and $T_4$, respectively) are used for the input samples. One should note the variations that are possible when only one limit is used or when the two limits have the same absolute value.

Figure 18:
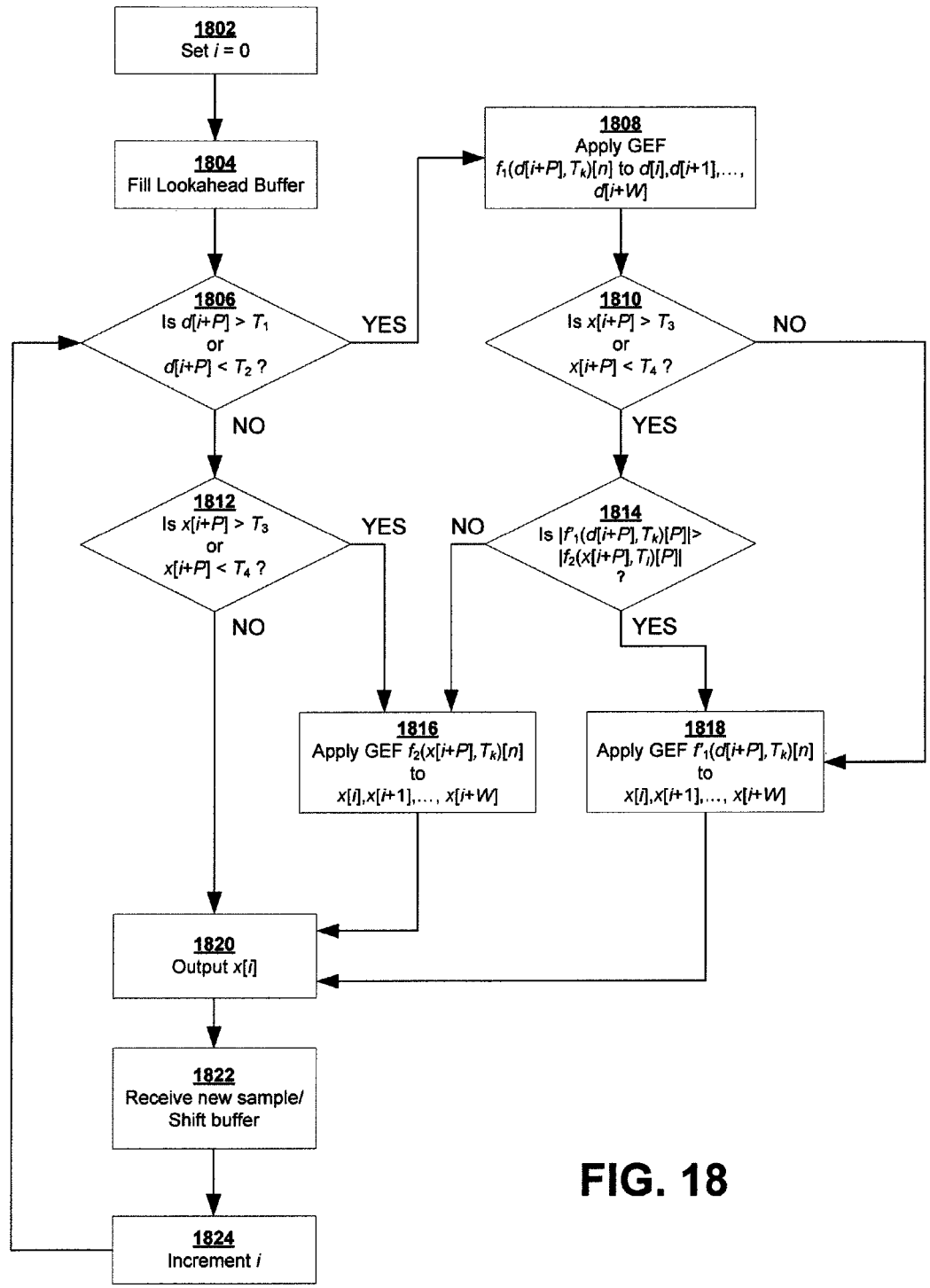
FIG. 18 is a flowchart illustrating an exemplary embodiment of a method employed by the analysis engine.

More specifically, FIG. 18 is a flowchart illustrating an exemplary embodiment of a method employed by analysis engine 1702 to ensure the output values remain below a given threshold. At step 1802 an index variable denoted by i is initialized to zero. At step 1804, look-ahead buffer 1302 is filled with W+1 input samples and W+1 displacement samples. At step 1806, a comparison is made of displacement sample d[i+P] to threshold values $T_1$ and $T_2$.

If no threshold is exceeded then at step 1812, a comparison is made of input sample x[i+P] to threshold values $T_3$ and $T_4$. If x[i+P]>$T_3$ then at step 1816, a gain envelope function $f_2$(x[i+P], $T_3$)[n] is applied to all input samples in the look-ahead buffer, that is x[i], x[i+1], . . . , x[i+W], or if x[i+P]<$T_4$ then at step 1816, a gain envelope function $f_2$(x[i+P], $T_4$)[n] is applied to all displacement samples in the look-ahead buffer. Specifically, each sample x[i+j] is replaced by x[i+j]×$f_2$(d[i+P], $T_1$)[j] in look-ahead buffer 1302, where l=1 or 2 depending on which threshold was exceeded in step 1818. However, if a threshold is exceeded at step 1806, then the process goes to step 1808. If d[i+P]>$T_1$ then at step 1808, a gain envelope function $f_1$(d[i+P], $T_1$)[n] is applied to all displacement samples in the look-ahead buffer, that is d[i], d[i+1], . . . , d[i+W], or if d[i+P]<$T_2$ then at step 1808, a gain envelope function $f_1$(d[i+P], $T_2$)[n] is applied to all displacement samples in the look-ahead buffer. Specifically, each sample d[i+j] is replaced by d[i+j]×$f_1$(d[i+P], $T_k$)[j] in look-ahead buffer 1302, where k=1 or 2 depending on which threshold was determined exceeded in step 1806.

At step 1810, a comparison is made of input sample x[i+P] to threshold values $T_3$ and $T_4$. If no threshold is exceeded then at step 1818, a gain envelope function $f_1$'(d[i+P], $T_k$)[n] is applied to all input samples in the look-ahead buffer, that is x[i], x[i+1], . . . , x[i+W]. Specifically, each sample x[i+j] is replaced by x[i+j]×$f_2$'(d[i+P], $T_k$)[j]. If a threshold is exceeded at step 1810, then a comparison is made between |$f_1$(d[i+p], $T_1$k| and |$f_2$(d[i+P], $T_j$)[j]|. If |$f_1$(d[i+p], $T_1$k|>|$f_2$(d[i+P], $T_1$)[j]|, then at step 1818, a gain envelope function $f_1'(d[i+P], T_k)[n]$ is applied to all input samples in the look-ahead buffer, otherwise at step 1816, a gain envelope function $f_2(x[i+P], T_1)[n]$ is applied to all displacement samples in the look-ahead buffer. At step 1820, x[i] is sent to the output. At step 1822, the sample x[i] is removed from the look-ahead buffer and sample x[i+W+1] is added to the look-ahead buffer so the look-ahead buffer now holds samples x[i+1], x[i+2], ..., x[i+W], x[i+W+1]. In addition the sample d[i] is removed from the look-ahead buffer and sample d[i+W+1] is added to the look-ahead buffer so the look-ahead buffer now holds samples d[i+1], d[i+2], ... d[i+w], d[i+W+1]. At step 1824, the index variable i is incremented. The process can then repeat at step 1806.

The gain envelope family of functions applied to the displacement samples and to the input samples denoted by $f_1$ and $f_2$ can be the same family or can be different. For simplicity, the same family can be used for both. Just as in FIG. 14, $f_1'$ and $f_1$ are related family of gain envelope functions. In the simplest case $f_1'=f_1$, however, by introducing a linear factor, $f_1'$ and $f_1$ can still have a simple relationship while maintaining the flexibility to address the discrepancy between the gain need to prevent mechanical distortion and the gain factor determined by comparing the displacement to the threshold. Mathematically, such an example can be expressed as $f_1'(M, T)=f_1(\alpha M,T)$ where $\alpha$ is a predetermined constant.

Figure 19:
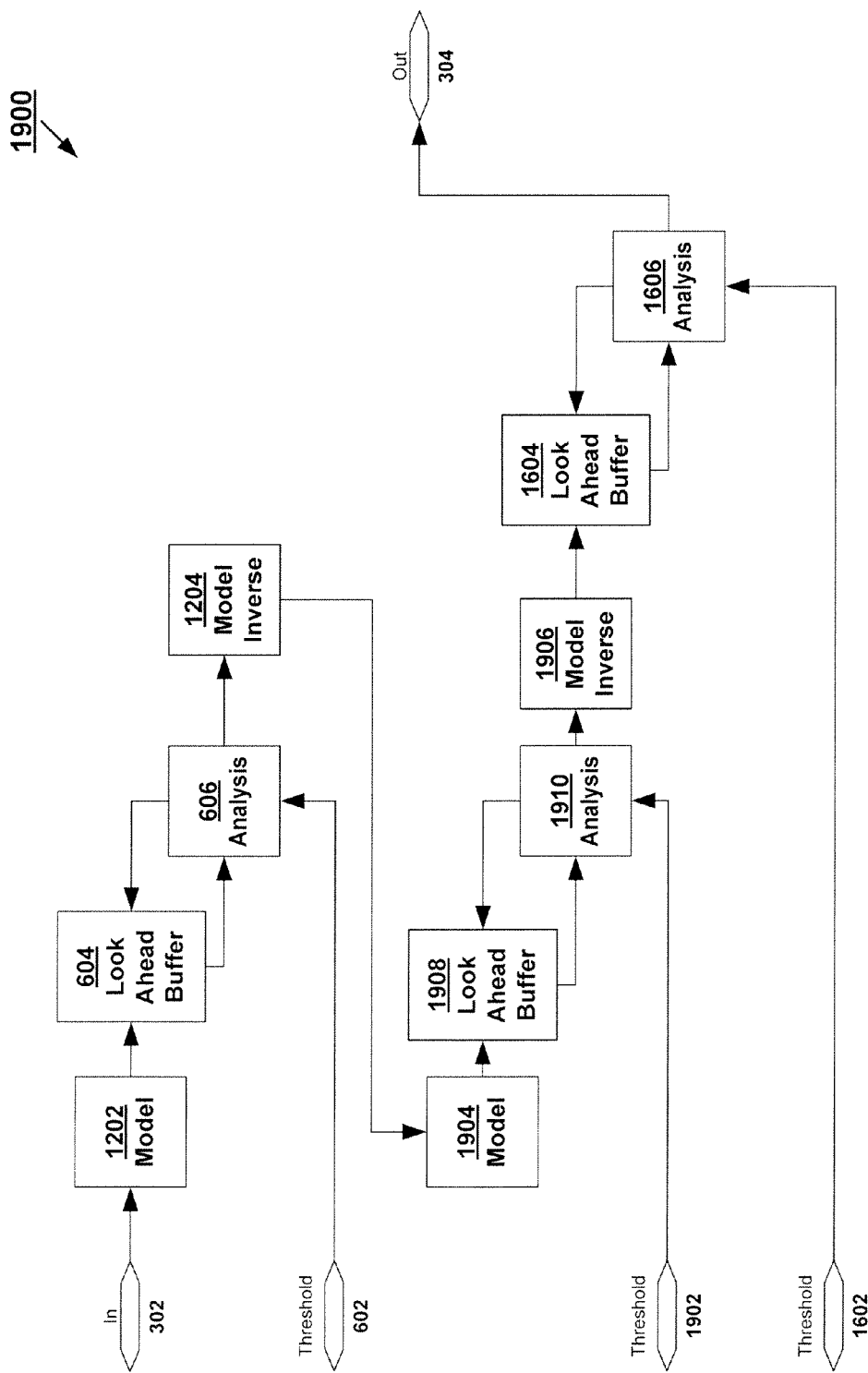
FIG. 19 shows an embodiment of a peak reduction system for limiting an input signal and two derived signals generated by two models.

The principles illustrated in systems 1600 and 1700 can be extended to multiple models and multiple threshold conditions. FIG. 19 shows an embodiment of a peak reduction system for limiting an input signal and two derived signals generated by two models. System 1900 comprises three cascaded peak reduction systems. The first peak reduction system comprises model 1202, look-ahead buffer 604, analysis engine 606 and model inverse 1204. It operates similar to system 1200. Basically, model 1202 generates a derived signal which is subjected to threshold value(s) 602. The second peak reduction system comprises model 1904, look-ahead buffer 1908, analysis engine 1910 and model inverse 1906. This system operates similarly to system 1200, except model 1904 generates a different derived signal and look-ahead buffer 1908 contains a set of look-ahead samples of this different derived signal. This derived signal is subjected to threshold value(s) 1902. Finally, the third peak reduction system comprises look-ahead buffer 1604 and analysis engine 1606 can reduce peaks based on the input signal.

Once again, the order of cascade can be shuffled in any suitable order. The limitation of this approach is that it is only applicable when a viable inverse model is available for each of the models shown. In addition, each look-ahead buffer delays the output by the buffer width. If the buffer sizes are the same, a three stage cascade can triple the delay between input and output.

Figure 20:
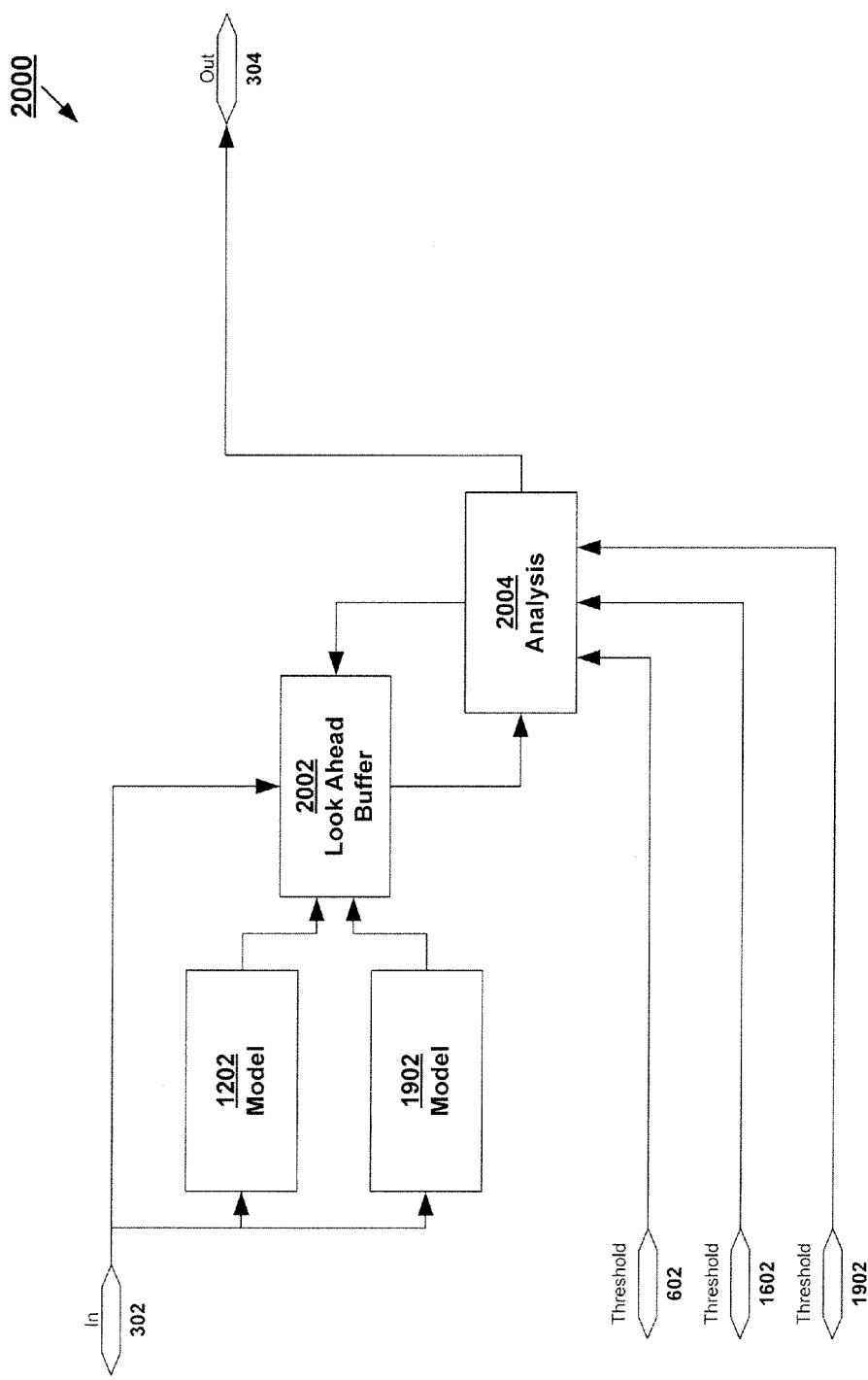
FIG. 20 shows an embodiment of a peak reduction system for limiting an input signal and two derived signals generated by two models.

FIG. 20 shows an embodiment of a peak reduction system for limiting an input signal and two derived signals generated by two models. System 2000 comprises model 1202, which generates a first derived signal, model 1902, which generates a second derived signal, look-ahead buffer 2002, which stores W+1 samples of the input signal, W+1 samples of the first derived signal and W+1 samples of the second derived signal, and analysis engine 2004, which receives threshold value(s) 602 that is used to limit the first derived signal, threshold value(s) 1902 which is used to limit the second derived signal, and threshold value(s) 1602 which is used to limit the input signal. The operation of analysis engine follows a flow chart similar to that shown in FIG. 18 but with additional complexity for the number of combinations available. In summary, the process applies a gain envelope function to the first derived signal whenever the first derived signal at i+P exceeds threshold value(s) 602. A gain envelope function is applied to the second derived signal whenever the second derived signal at i+P exceeds threshold value(s) 1902. The choice of which gain envelope function is applied to the input signal depends on which thresholds are exceeded. If the first derived signal at i+P exceeds threshold value(s) 602 a related gain envelope function might be applied to the input signal. If the second derived signal at i+P exceeds threshold value(s) 1902, a related gain envelope function might be applied to the input signal. If the input signal exceeds threshold value(s) 1602, a gain envelope function might be applied to the input signal. The gain envelope function that is actually applied is one of the three possible gain envelope function which attenuates the input signal the most at i+P.

FIG. 4 as described above depicts a cellular telephone equipped with look-ahead peak reduction. Cellular telephones are susceptible to mechanical distortion such as rub and buzz and electronic saturation distortion. FIG. 16 as described above depicts a look-ahead peak reduction system which can be applied to the cellular telephone environment where threshold 602 is a displacement threshold and threshold 1602 is a signal threshold. The displacement threshold is intended to prevent rub and buzz distortion and the signal threshold is intended to prevent electronic saturation. An alternate embodiment of a look-ahead peak reduction system shown in FIG. 17 can also be used to prevent distortion in a cellular telephone.

In many cellular telephones, however, the supply voltages depend on the battery power level. As a cellular telephone's battery begins to deplete, the voltage powering many of the internal circuits begins to decline. As this voltage can define the linear region in many of the electronic components particularly in the audio path, the threshold of saturation will start to reduce as the battery power depletes. As a result, the signal threshold should be adjusted as the battery power drops.

Figure 21:
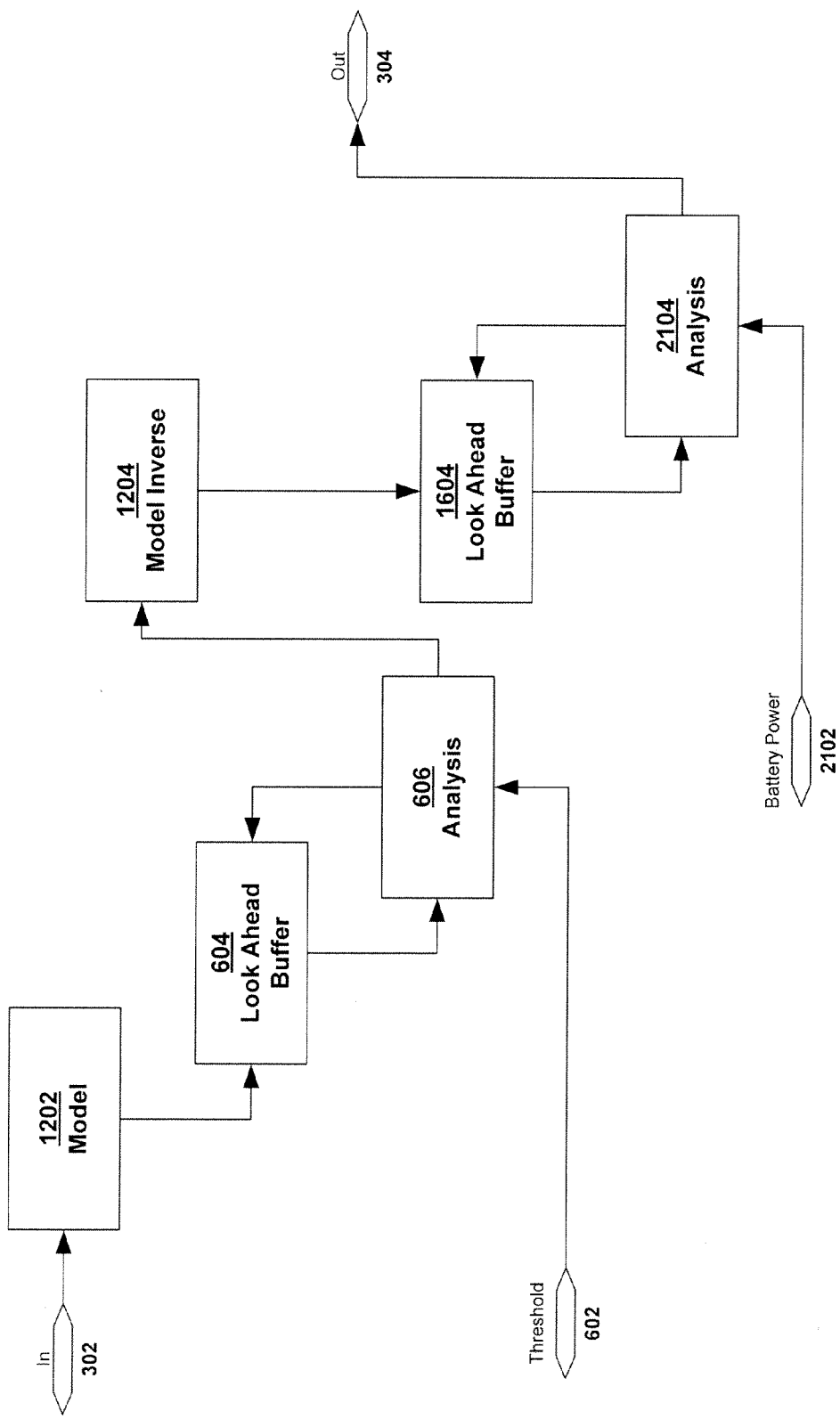
FIG. 21 is an embodiment of a look-ahead peak reduction system used in a cellular telephone.

FIG. 21 is an embodiment of a look-ahead peak reduction system used in a cellular telephone. The peak reduction system is similar to that shown in FIG. 16. The displacement portion comprising model 1202, look-ahead buffer 604, analysis engine 606 and model inverse 1204, function essentially as described previously in FIG. 16. The electronic saturation portion comprises look-ahead buffer 1604 which stores signal W+1 signal values and analysis engine 2104. Unlike analysis engine 1606, analysis engine 2104 receives battery power 2102 instead of threshold 1602. Analysis engine 2104 operates similarly to analysis engine 1606 except that it computes a signal threshold to be used in the peak reduction from battery power 2102 rather than receiving the signal threshold.

Figure 22:
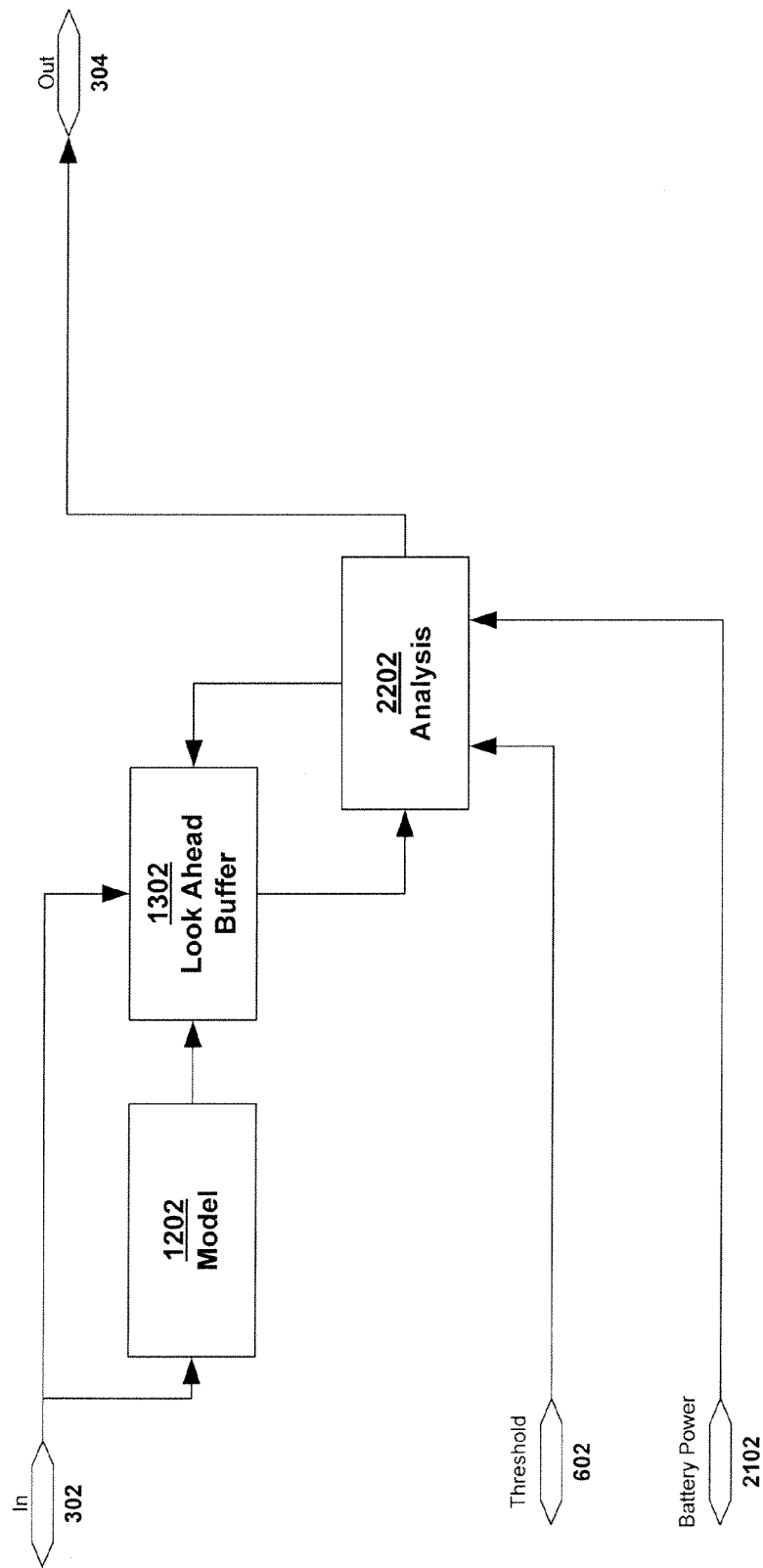
FIG. 22 is another embodiment of a look-ahead peak reduction system used in a cellular telephone.

FIG. 22 is another embodiment of a look-ahead peak reduction system used in a cellular telephone. The peak reduction system is similar to that shown in FIG. 17. Like the system in FIG. 17, it comprises model 1202, look-ahead buffer 1302 which stores W+1 input samples and W+1 displacement samples. Unlike analysis engine 1702, analysis engine 2202 receives battery power 2102 instead of threshold 1602. Analysis engine 2202 operates similarly to analysis engine 1702 except it computes a signal threshold to be used in the peak reduction from battery power 2102 rather than receiving the signal threshold.

In general, a suitable dynamic range compression or dynamic gain adjustment technique can be used to protect the output from electrical saturation distortion and can be modified to accept a battery power level and adjust the signal threshold on the basis of the battery power.

These implementations have proven to be very effective in a cellular telephone for reducing mechanical distortion and distortion from electrical saturation. As a result, distortion in a cellular telephone can be reduced without the perception of a reduction in loudness.

In an audio reproduction device such as in a personal computer, amplifiers have a specific output rating. Likewise, speakers are also given a power rating. In a typical device, amplifiers are typically paired with speakers of the same rating. Unfortunately, the power ratings tend to be based on a sinusoidal type signal. When a square wave is generated or other severely distorted signal is generated, an amplifier could actually be driving more power than its rating, and in some cases the potential power can be double the power rating.

While professional, studio generated content is typically free of this issue, consumption of user-generated content such as Youtube videos is growing in usage, and such content can contain square wave like signals, distorted signals, signals with high DC levels and other problematic signal types that can cause amplifiers, especially a class-D amplifier, to have higher output levels than the speakers are rated for. Also, some applications can digitally introduce excessive gain to an audio playback. When a speaker is overdriven for a prolonged period of time, it can become damaged.

One solution is to pair the amplifier with a speaker rated for twice the power rating. However, this is more costly, and the speaker is larger and may no longer fit in the desired form factor. Another solution is to set the amplifier output level to ½ of its allowable power rating. However, this limits the amount of power the amplifier can deliver. Because of the ubiquity of non-commercial and user-generated content, the end user can no longer be relied upon not to playback potentially damaging content.

Figure 23:
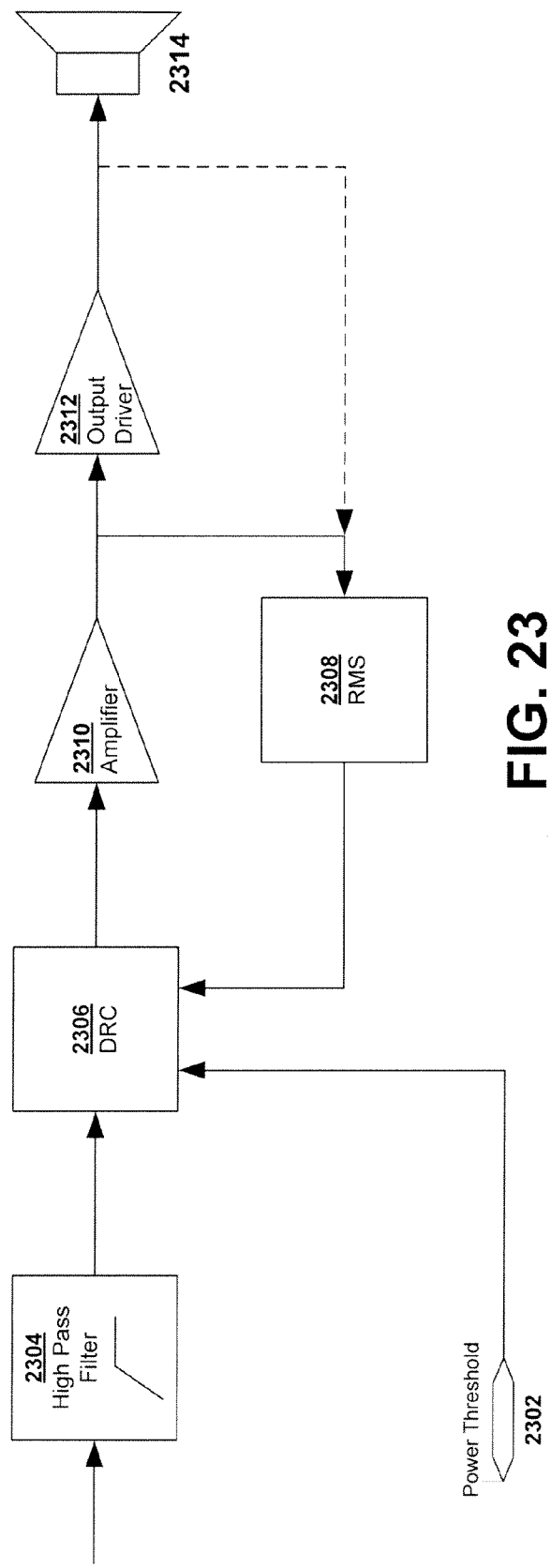
FIG. 23 illustrates an embodiment of an audio driver and speaker equipped with closed loop speaker protection.

FIG. 23 illustrates an embodiment of an audio driver and speaker equipped with closed loop speaker protection. The audio driver comprises high pass filter 2304, dynamic range compressor (DRC) 2306, RMS module 2308, amplifier 2310, and output driver 2312. High pass filter 2304 is used to prevent a DC component from being amplified. Amplifier 2310 shown here is a class-D amplifier, but can also be a digital to analog converter (DAC) coupled with an analog amplifier. Output driver 2312 drives speaker 2314. In an alternate embodiment, the audio driver could be one stage (i.e., amplifier 2310 and output driver 2312 are combined) or three stages among other configurations. DRC 2306 receives an input power measurement or estimate from RMS module 2308 and power threshold 2302.

DRC 2306 receives an output power measurement or power estimate from RMS module 2308 and power threshold 2302. RMS module 2308 may comprise an analog to digital converter, as the output signal may be an analog signal. RMS module 2308 may also sample the output signal. In one embodiment, DRC 2306 is an adjustable gain amplifier that does nothing unless the output power of the amplifier is greater than power threshold 2302. If the output RMS value is greater than power threshold 2302, the gain is set to $$\frac{T}{P_y},$$

or in dB to $T-20 \log_{10}(P_y)$, where T is power threshold 2302 and $P_y$ is the output power and $P_{yy}$ is the output power, i.e., $P_{yy}=P_y^2$. The output RMS value $P_y$ is a short term average of output signal y given by equation (4). The output RMS value can be approximated by a sliding average given in equation (5).

$$P_y[n] = \sqrt{\sum_{i=0}^{N} \frac{y^2[i+n]}{N+1}} \quad (4)$$

$$P_y[n] \approx \alpha P_y[n-1]+(1-\alpha)|y[n]| \quad (5)$$

$$P_{yy}[n] \approx \alpha P_{yy}[n-1]+(1-\alpha)|y[n]|^2 \quad (6)$$

$$P_{hy}[n] \approx \alpha P_{yy}[n-1]+(1-\alpha)h(|y[n]|^2) \quad (7)$$

Alternatively, it may be more desirable to work with $y^2$ rather than y, so the gain is set to $$\frac{T}{\sqrt{P_{yy}}}$$

or in dB to $T-10 \log_{10}(P_{yy})$, where $P_{yy}$ can be approximated by equation (6). In general, any suitable type of function of power squared can be used and can be approximated by equation (7). If $h(x)=\sqrt{x}$, equation (7) becomes equation (5). If $h(x)=10 \log_{10}(x)$, equation (7) uses power as measured in dB and the gain could be set to $T-P_{hy}$. Since the excess power is only problematic if it is persistent, the adjustment of the gain of DRC 2306 can be smoothed either by low pass filtering the gain or by giving the gain adjustment an attack and release time.

In another embodiment, the look-ahead peak reduction system in FIG. 6 can also be applied, in order to incorporate power into a family of gain envelope functions, such as by equation (3). In another embodiment, the look-ahead peak reduction system in FIG. 13 can also be applied.

In addition to power considerations, peak control is another consideration of when applying DRC 2306. Therefore DRC 2306 can adjust its gain for clipping and for speaker protection. In one embodiment, a gain is determined for clipping control. However, if the output power is still greater than the predetermined threshold for speaker protection, the gain is reduced as needed for speaker protection. In another embodiment, a gain is applied for the clipping control and a second independent gain is applied for speaker protection, in effect cascading two DRCs, one for clipping control and one for speaker protection. In yet another embodiment, power is used as an input to the DRC rather than the audio signal.

Figure 24:
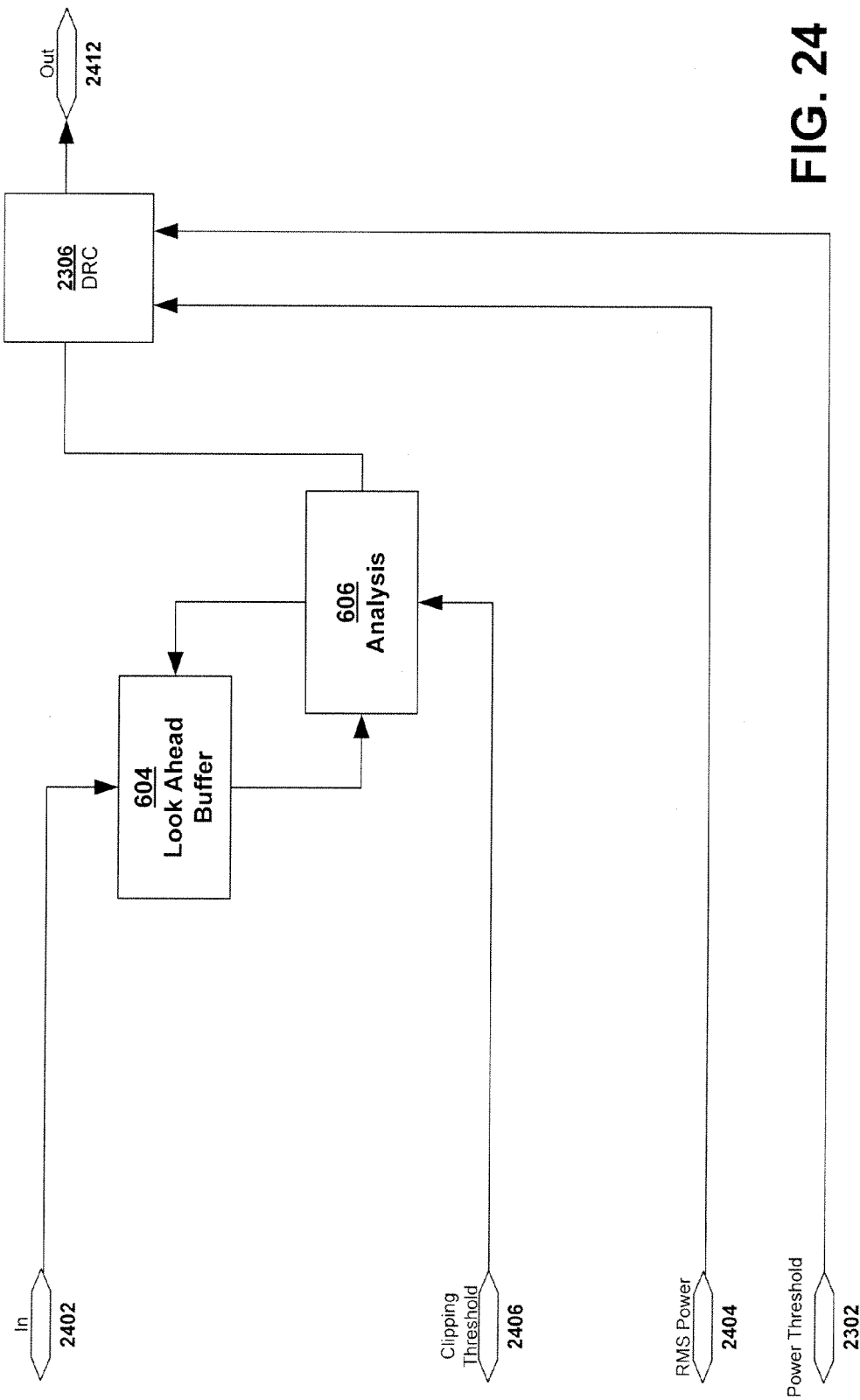
FIG. 24 is another embodiment of a dynamic range compression system which can be applied to speaker protection.

FIG. 24 is another embodiment of a dynamic range compression system which can be applied to speaker protection. It comprises look-ahead buffer 604, analysis engine 606 and DRC 2306. Look-ahead buffer stores W+1 samples of input signal x. Analysis engine 606 function as described above. Look-ahead buffer 604 and analysis engine 606 is a look-ahead peak reduction system used to control look-ahead used for clipping control. The look-ahead peak reduction system receives input signal 2402 and clipping threshold 2406 and produces an output signal which is sent to DRC 2306 which receives closed loop RMS power 2404 and RMS threshold 2302. If the output power is still greater than the predetermined threshold for speaker protection, then a gain is applied by DRC 2306 to bring the power down in the manner described above. Alternatively, DRC 2306 can derive a gain independently of the result of the look-ahead peak reducer and apply the gain to produce output signal 2412.

Figure 25:
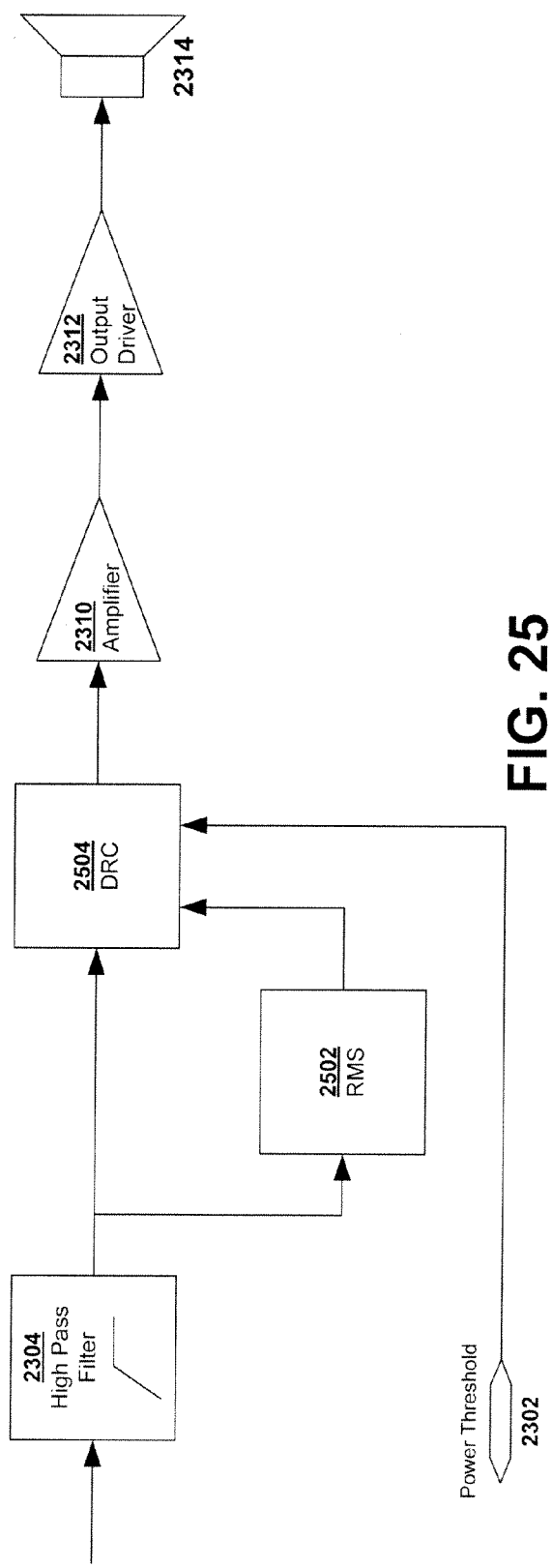
FIG. 25 illustrates an embodiment of an audio driver and speaker equipped with speaker protection in an open loop configuration.

FIG. 25 illustrates an embodiment of an audio driver and speaker equipped with speaker protection in an open loop configuration. The audio driver comprises high pass filter 2304, DRC 2504, RMS module 2502, amplifier 2310, and output driver 2312. DRC 2504 receives an input power measurement or estimate from RMS module 2502 and power threshold 2302. In one embodiment, DRC 2306 is an adjustable gain amplifier that does nothing unless the input power to the amplifier is greater than power threshold 2302. If the input power $P_{xx}$ times the amplifier gain G squared is greater than power threshold 2302, the DRC gain is set to $$\frac{T}{G\sqrt{P_{xx}}},$$

where T is power threshold 2302 and $P_x$ is the input power. Once again, the DRC gain can be smoothed either by low pass filtering the gain or by giving the gain adjustment an attack and release time. In another embodiment, the look-ahead peak reduction system in FIG. 13 can also be applied. Model 1202 as applied to this circumstance maps input samples x[n] to power samples $P_{xx}$[n]. By using the look-ahead peak reduction system in FIG. 13, power can be reduced in the output signal where the power reduction is smoothly applied. In yet another embodiment, the look-ahead peak reduction system in FIG. 6 can also be applied. Power is incorporated into family of gain envelope functions, such as by equation (3). In still another embodiment, the look-ahead peak reduction system in FIG. 6 can be used where analysis engine 606 employs the method disclosed in FIG. 26.

The embodiments of the speaker protection described above protect the speaker from prolonged overdriving without limiting the power output for "good" content. It should be noted that other variations can be employed including a different order of components such as employing the DRC after the amplifier.

It should be emphasized that the above-described embodiments are merely examples of possible implementations. Many variations and modifications may be made to the above-described embodiments without departing from the principles of the present disclosure. All such modifications and variations are intended to be included herein within the scope of this disclosure and protected by the following claims.

What is claimed is:

1. A system comprising:
    an audio driver including:
        a displacement model operable to convert a digital audio signal into a displacement signal;
        a look-ahead buffer operable to hold a plurality of samples of the displacement signal;
        an analysis module operable to determine whether a sample of the plurality of samples in the look-ahead buffer has a value which exceeds a threshold value, and if the sample exceeds the threshold value, to apply a gain envelope function to the plurality of samples in the look-ahead buffer; and
        a model inverse operable to convert the displacement signal back into the digital audio signal.

2. The system of claim 1, wherein the sample is in a predetermined position.

3. The system of claim 1, wherein the gain envelope function is selected using the formula $$f(M, T)[n] = 1 - (1 - |T/M|)g[n],$$

where:
    M is the value of the sample in the predetermined position,
    T is the given threshold and
    g[n] is a function where g[0]=0, g[W]=0 and g[P]=1, where P is an index of the predetermined position.

4. The system of claim 1, wherein the gain envelope function is selected using the formula $$f(M, T)[n] = G - \left(G - \left|\frac{T}{M}\right|\right)g[n],$$

where:
    M is the value of the sample in the predetermined position,
    T is the given threshold and
    g[n] is a function where, g[0]=0, g[W]=0 and g[P]=1, where P is an index of the predetermined position and G is a predetermined gain factor.

5. The system of claim 1, further comprising:
    a battery level detector operable to generate a battery level signal representing a power level of a battery, wherein the threshold value is determined by the analysis module as a function of the battery level signal.

6. The system of claim 5, wherein the analysis module is also operable to receive the battery level signal.

7. The system of claim 1 further comprising:
    a second look-ahead buffer operable to hold another plurality of samples of the digital audio signal received from the model inverse;
    a second analysis module operable to apply a gain envelope function to all of the another plurality of samples if a sample in a second predetermined position exceeds a second threshold.

8. The system of claim 1 comprising comprising:
    a second displacement model operable to convert the digital audio signal output from the model inverse into a second displacement signal;
    a second look-ahead buffer operable to hold another plurality of samples of the second displacement signal; and
    a second analysis module operable to determine whether a sample of the another plurality of samples in a predetermined position in the second look-ahead buffer has a value which exceeds a second threshold by determining whether the sample of the digital audio signal in the predetermined position exceeds the second threshold; and
    a second model inverse operable to convert the second displacement signal back into the digital audio signal.

9. The system of claim 1, wherein the gain envelope function is selected on the basis of the value of the samples in the look-ahead buffer and the threshold value.

10. A system comprising:
    an audio driver including:
        a root-mean-square estimation (RMS) module;
        a dynamic range compressor (DRC) applying a gain to an audio signal, wherein the gain of the DRC is determined as a function of an RMS estimation from the RMS module and a RMS power threshold;
        a displacement model operable to convert the audio signal output by the DRC into a displacement signal;
        a look-ahead buffer operable to hold a plurality of samples of the displacement signal;
        an analysis module operable to determine whether a sample of the plurality of samples in the look-ahead buffer has a value which exceeds a threshold value, and if the sample exceeds the threshold value, to apply a gain envelope function to the plurality of samples in the look-ahead buffer; and
        a model inverse operable to convert the displacement signal back into the audio signal.

11. The system of claim 10 wherein the RMS module generates the RMS estimation as a function of power received from a high pass filter.

12. The system of claim 10 wherein the RMS module generates the RMS estimation as a function of power received from an amplifier.

13. The system of claim 10 wherein the RMS module generates the RMS estimation as a function of power received from the audio driver.

14. The system of claim 10 wherein the sample is in a predetermined position, and wherein the gain envelope function is selected on the basis of the value of the plurality of samples in the look-ahead buffer and the threshold value.

15. A method for limiting peaks in a first digital signal, the method comprising:
 converting a digital audio signal into a displacement signal using a displacement model;
 storing a plurality of samples of the displacement signal in a look-ahead buffer;
 determining whether a sample of the plurality of samples in a predetermined position in the look-ahead buffer has a value which exceeds a given threshold;
 if the sample exceeds the given threshold, applying a gain envelope function to the plurality of samples in the look-ahead buffer, where the gain envelope function is selected on the basis of the value of the plurality of samples in the look-ahead buffer and the given threshold; and
 converting the displacement signal back into the digital audio signal using a model inverse.

16. The method of claim 15, wherein the gain envelope function is selected using the formula $$f(M, T)[n] = G - \left(G - \left|\frac{T}{M}\right|\right)g[n],$$

where:
 M is the value of the sample in a predetermined position,
 T is the given threshold and
 g[n] is a function where g[0]=0, g[W]=0 and g[P]=1, where p is an index of the predetermined position and G is a predetermined gain factor.

17. The method of claim 16, wherein G=1.

18. The method of claim 15, further comprising:
 receiving a battery power level; and
 determining the given threshold on the basis of the battery power level.

19. The method of claim 15, wherein the sample is in a predetermined position.

20. The method of claim 15, further comprising:
 storing another plurality of samples of the digital audio signal output by the model inverse in a second look-ahead buffer;
 limiting peaks in the digital audio signal output by the model inverse on the basis of a second given threshold.

* * * * *